(12) United States Patent
Bertness

(10) Patent No.: US 8,513,949 B2
(45) Date of Patent: *Aug. 20, 2013

(54) ELECTRONIC BATTERY TESTER OR CHARGER WITH DATABUS CONNECTION

(75) Inventor: Kevin I. Bertness, Batavia, IL (US)

(73) Assignee: Midtronics, Inc., Willowbrook, IL (US)

( * ) Notice: Subject to any disclaimer, the term of this patent is extended or adjusted under 35 U.S.C. 154(b) by 781 days.

This patent is subject to a terminal disclaimer.

(21) Appl. No.: 12/204,141

(22) Filed: Sep. 4, 2008

(65) Prior Publication Data

US 2008/0315830 A1  Dec. 25, 2008

Related U.S. Application Data

(63) Continuation-in-part of application No. 11/063,247, filed on Feb. 22, 2005, now Pat. No. 7,598,743, which is a continuation-in-part of application No. 10/958,812, filed on Oct. 5, 2004, now Pat. No. 7,446,536, which is a continuation-in-part of application No. 10/460,749, filed on Jun. 12, 2003, now Pat. No. 6,967,484, which is a continuation-in-part of application No. 10/280,186, filed on Oct. 25, 2002, now Pat. No. 6,759,849, which is a continuation-in-part of application No. 09/816,768, filed on Mar. 23, 2001, now Pat. No. 6,586,941.

(60) Provisional application No. 60/192,222, filed on Mar. 27, 2000.

(51) Int. Cl.
*G01N 27/416* (2006.01)

(52) U.S. Cl.
USPC .......................................... 324/426; 324/432

(58) Field of Classification Search
USPC .................................................. 320/426–433
See application file for complete search history.

(56) References Cited

U.S. PATENT DOCUMENTS

| | | | |
|---|---|---|---|
| 85,553 A | 1/1869 | Adams | 33/472 |
| 2,000,665 A | 5/1935 | Neal | 439/440 |
| 2,417,940 A | 3/1947 | Lehman | 200/61.25 |
| 2,514,745 A | 7/1950 | Dalzell | 324/115 |

(Continued)

FOREIGN PATENT DOCUMENTS

| | | |
|---|---|---|
| DE | 29 26 716 B1 | 1/1981 |
| DE | 196 38 324 | 9/1996 |

(Continued)

OTHER PUBLICATIONS

"Notification of Transmittal of the International Search Report and the Written Opinion of the International Searching Authority, or the Declaration" PCT/US2008/008702 filed Jul. 2008; 15 pages.

(Continued)

*Primary Examiner* — Samuel Berhanu
(74) *Attorney, Agent, or Firm* — Westman, Champlin & Kelly, P.A.

(57) ABSTRACT

Vehicle maintenance circuitry for use with a storage battery, and/or electrical system of a vehicle includes an electrical connector configured to electrically couple to the vehicle. OBD communication circuitry is configured to couple to an OBD databus of a vehicle. The operation of the vehicle maintenance circuitry is a function of communication on the OBD databus.

30 Claims, 7 Drawing Sheets

(56) References Cited

U.S. PATENT DOCUMENTS

| | | | |
|---|---|---|---|
| 2,727,221 A | 12/1955 | Springg | 340/447 |
| 3,267,452 A | 12/1963 | Wolf | 340/249 |
| 3,223,969 A | 12/1965 | Alexander | 340/447 |
| 3,356,936 A | 12/1967 | Smith | 324/429 |
| 3,562,634 A | 2/1971 | Latner | 324/427 |
| 3,593,099 A | 7/1971 | Scholl | 320/127 |
| 3,607,673 A | 9/1971 | Seyl | 324/425 |
| 3,652,341 A | 3/1972 | Halsall et al. | 29/623.2 |
| 3,676,770 A | 7/1972 | Sharaf et al. | 324/430 |
| 3,729,989 A | 5/1973 | Little | 73/862.192 |
| 3,750,011 A | 7/1973 | Kreps | 324/430 |
| 3,753,094 A | 8/1973 | Furuishi et al. | 324/430 |
| 3,776,177 A | 12/1973 | Bryant et al. | 116/311 |
| 3,796,124 A | 3/1974 | Crosa | 411/521 |
| 3,808,522 A | 4/1974 | Sharaf | 324/430 |
| 3,811,089 A | 5/1974 | Strzelewicz | 324/170 |
| 3,816,805 A | 6/1974 | Terry | 320/123 |
| 3,850,490 A | 11/1974 | Zehr | 439/822 |
| 3,873,911 A | 3/1975 | Champlin | 324/430 |
| 3,876,931 A | 4/1975 | Godshalk | 324/429 |
| 3,886,426 A | 5/1975 | Daggett | 320/117 |
| 3,886,443 A | 5/1975 | Miyakawa et al. | 324/426 |
| 3,889,248 A | 6/1975 | Ritter | 340/636.11 |
| 3,906,329 A | 9/1975 | Bader | 320/134 |
| 3,909,708 A | 9/1975 | Champlin | 324/431 |
| 3,936,744 A | 2/1976 | Perlmutter | 324/772 |
| 3,946,299 A | 3/1976 | Christianson et al. | 320/430 |
| 3,947,757 A | 3/1976 | Grube et al. | 324/416 |
| 3,969,667 A | 7/1976 | McWilliams | 324/427 |
| 3,979,664 A | 9/1976 | Harris | 324/397 |
| 3,984,762 A | 10/1976 | Dowgiallo, Jr. | 324/430 |
| 3,984,768 A | 10/1976 | Staples | 324/712 |
| 3,989,544 A | 11/1976 | Santo | 429/65 |
| 4,008,619 A | 2/1977 | Alcaide et al. | 73/724 |
| 4,023,882 A | 5/1977 | Pettersson | 439/426 |
| 4,024,953 A | 5/1977 | Nailor, III | 206/344 |
| 4,047,091 A | 9/1977 | Hutchines et al. | 363/59 |
| 4,053,824 A | 10/1977 | Dupuis et al. | 324/434 |
| 4,056,764 A | 11/1977 | Endo et al. | 320/101 |
| 4,057,313 A | 11/1977 | Polizzano | 439/219 |
| 4,070,624 A | 1/1978 | Taylor | 324/772 |
| 4,086,531 A | 4/1978 | Bernier | 324/772 |
| 4,106,025 A | 8/1978 | Katz | 343/715 |
| 4,112,351 A | 9/1978 | Back et al. | 324/380 |
| 4,114,083 A | 9/1978 | Benham et al. | 340/636.13 |
| 4,126,874 A | 11/1978 | Suzuki et al. | 396/301 |
| 4,160,916 A | 7/1979 | Papasideris | 307/10.6 |
| 4,178,546 A | 12/1979 | Hulls et al. | 324/772 |
| 4,193,025 A | 3/1980 | Frailing et al. | 324/427 |
| 4,207,611 A | 6/1980 | Gordon | 701/33 |
| 4,217,645 A | 8/1980 | Barry et al. | 702/63 |
| 4,280,457 A | 7/1981 | Bloxham | 123/198 R |
| 4,297,639 A | 10/1981 | Branham | 324/429 |
| 4,307,342 A | 12/1981 | Peterson | 324/767 |
| 4,315,204 A | 2/1982 | Sievers et al. | 322/28 |
| 4,316,185 A | 2/1982 | Watrous et al. | 340/636.11 |
| 4,322,685 A | 3/1982 | Frailing et al. | 324/429 |
| 4,351,405 A | 9/1982 | Fields et al. | 180/65.2 |
| 4,352,067 A | 9/1982 | Ottone | 324/434 |
| 4,360,780 A | 11/1982 | Skutch, Jr. | 324/437 |
| 4,361,809 A | 11/1982 | Bil et al. | 324/426 |
| 4,363,407 A | 12/1982 | Buckler et al. | 209/3.3 |
| 4,369,407 A | 1/1983 | Korbell | 324/416 |
| 4,379,989 A | 4/1983 | Kurz et al. | 320/165 |
| 4,379,990 A | 4/1983 | Sievers et al. | 322/99 |
| 4,385,269 A | 5/1983 | Aspinwall et al. | 320/129 |
| 4,390,828 A | 6/1983 | Converse et al. | 320/153 |
| 4,392,101 A | 7/1983 | Saar et al. | 320/156 |
| 4,396,880 A | 8/1983 | Windebank | 320/156 |
| 4,408,157 A | 10/1983 | Beaubien | 324/712 |
| 4,412,169 A | 10/1983 | Dell'Orto | 320/123 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,441,359 A | 4/1984 | Ezoe | 73/116.06 |
| 4,459,548 A | 7/1984 | Lentz et al. | 324/472 |
| 4,514,694 A | 4/1985 | Finger | 324/429 |
| 4,520,353 A | 5/1985 | McAuliffe | 340/636.16 |
| 4,521,498 A | 6/1985 | Juergens | 429/59 |
| 4,564,798 A | 1/1986 | Young | 320/103 |
| 4,620,767 A | 11/1986 | Woolf | 439/217 |
| 4,633,418 A | 12/1986 | Bishop | 702/63 |
| 4,637,359 A | 1/1987 | Cook | 123/179 |
| 4,659,977 A | 4/1987 | Kissel et al. | 320/150 |
| 4,663,580 A | 5/1987 | Wortman | 320/153 |
| 4,665,370 A | 5/1987 | Holland | 324/429 |
| 4,667,143 A | 5/1987 | Cooper et al. | 320/153 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/165 |
| 4,686,442 A | 8/1987 | Radomski | 320/123 |
| 4,697,134 A | 9/1987 | Burkum et al. | 320/134 |
| 4,707,795 A | 11/1987 | Alber et al. | 702/63 |
| 4,709,202 A | 11/1987 | Koenck et al. | 320/112 |
| 4,710,861 A | 12/1987 | Kanner | 363/46 |
| 4,719,428 A | 1/1988 | Liebermann | 324/436 |
| 4,723,656 A | 2/1988 | Kiernan et al. | 206/705 |
| 4,743,855 A | 5/1988 | Randin et al. | 324/430 |
| 4,745,349 A | 5/1988 | Palanisamy et al. | 320/125 |
| 4,773,011 A | 9/1988 | VanHoose | 701/30 |
| 4,781,629 A | 11/1988 | Mize | 439/822 |
| 4,816,768 A | 3/1989 | Champlin | 324/428 |
| 4,820,966 A | 4/1989 | Fridman | 320/116 |
| 4,825,170 A | 4/1989 | Champlin | 324/436 |
| 4,847,547 A | 7/1989 | Eng, Jr. et al. | 320/153 |
| 4,849,700 A | 7/1989 | Morioka et al. | 324/427 |
| 4,874,679 A | 10/1989 | Miyagawa | 429/91 |
| 4,876,495 A | 10/1989 | Palanisamy et al. | 320/106 |
| 4,881,038 A | 11/1989 | Champlin | 324/426 |
| 4,885,523 A | 12/1989 | Koench | 230/131 |
| 4,888,716 A | 12/1989 | Ueno | 702/63 |
| 4,901,007 A | 2/1990 | Sworm | 324/110 |
| 4,907,176 A | 3/1990 | Bahnick et al. | 364/551.01 |
| 4,912,416 A | 3/1990 | Champlin | 324/430 |
| 4,913,116 A | 4/1990 | Katogi et al. | 123/406.32 |
| 4,926,330 A | 5/1990 | Abe et al. | 701/33 |
| 4,929,931 A | 5/1990 | McCuen | 340/636.15 |
| 4,931,738 A | 6/1990 | MacIntyre et al. | 324/435 |
| 4,932,905 A | 6/1990 | Richards | 439/822 |
| 4,933,845 A | 6/1990 | Hayes | 710/104 |
| 4,934,957 A | 6/1990 | Bellusci | 439/504 |
| 4,937,528 A | 6/1990 | Palanisamy | 324/430 |
| 4,947,124 A | 8/1990 | Hauser | 324/430 |
| 4,949,046 A | 8/1990 | Seyfang | 324/427 |
| 4,956,597 A | 9/1990 | Heavey et al. | 320/129 |
| 4,965,738 A | 10/1990 | Bauer et al. | 320/136 |
| 4,968,941 A | 11/1990 | Rogers | 324/428 |
| 4,968,942 A | 11/1990 | Palanisamy | 324/430 |
| 4,969,834 A | 11/1990 | Johnson | 439/141 |
| 4,983,086 A | 1/1991 | Hatrock | 411/259 |
| 5,004,979 A | 4/1991 | Marino et al. | 324/160 |
| 5,030,916 A | 7/1991 | Bokitch | 324/503 |
| 5,032,825 A | 7/1991 | Kuznicki | 340/636.15 |
| 5,034,893 A | 7/1991 | Fisher | 701/99 |
| 5,037,778 A | 8/1991 | Stark et al. | 228/121 |
| 5,047,722 A | 9/1991 | Wurst et al. | 324/430 |
| 5,081,565 A | 1/1992 | Nabha et al. | 362/465 |
| 5,087,881 A | 2/1992 | Peacock | 324/378 |
| 5,095,223 A | 3/1992 | Thomas | 307/110 |
| 5,108,320 A | 4/1992 | Kimber | 439/883 |
| 5,109,213 A | 4/1992 | Williams | 340/447 |
| 5,126,675 A | 6/1992 | Yang | 324/435 |
| 5,130,658 A | 7/1992 | Bohmer | 324/435 |
| 5,140,269 A | 8/1992 | Champlin | 324/433 |
| 5,144,218 A | 9/1992 | Bosscha | 320/139 |
| 5,144,248 A | 9/1992 | Alexandres et al. | 324/428 |
| 5,159,272 A | 10/1992 | Rao et al. | 324/429 |
| 5,160,881 A | 11/1992 | Schramm et al. | 322/7 |
| 5,168,208 A | 12/1992 | Schultz et al. | 322/25 |
| 5,170,124 A | 12/1992 | Blair et al. | 324/434 |
| 5,179,335 A | 1/1993 | Nor | 320/159 |
| 5,194,799 A | 3/1993 | Tomantschger | 320/103 |
| 5,204,611 A | 4/1993 | Nor et al. | 320/145 |

| | | | |
|---|---|---|---|
| 5,214,370 A | 5/1993 | Harm et al. ................... 320/152 |
| 5,214,385 A | 5/1993 | Gabriel et al. ................ 324/434 |
| 5,241,275 A | 8/1993 | Fang ............................ 324/430 |
| 5,254,952 A | 10/1993 | Salley et al. .................. 324/429 |
| 5,266,880 A | 11/1993 | Newland ...................... 320/125 |
| 5,278,759 A * | 1/1994 | Berra et al. ........................ 701/1 |
| 5,281,919 A | 1/1994 | Palanisamy ................... 324/427 |
| 5,281,920 A | 1/1994 | Wurst ........................... 324/430 |
| 5,295,078 A | 3/1994 | Stich et al. .................... 700/297 |
| 5,298,797 A | 3/1994 | Redl ............................. 327/387 |
| 5,300,874 A | 4/1994 | Shimamoto et al. ........... 320/106 |
| 5,302,902 A | 4/1994 | Groehl .......................... 324/434 |
| 5,311,973 A * | 5/1994 | Tseng et al. ..................... 191/10 |
| 5,313,152 A | 5/1994 | Wozniak et al. .............. 320/118 |
| 5,315,287 A | 5/1994 | Sol ............................... 340/455 |
| 5,321,626 A | 6/1994 | Palladino ........................ 702/63 |
| 5,321,627 A | 6/1994 | Reher ............................. 702/63 |
| 5,323,337 A | 6/1994 | Wilson et al. ................... 702/73 |
| 5,325,041 A | 6/1994 | Briggs .......................... 320/149 |
| 5,331,268 A | 7/1994 | Patino et al. .................. 320/158 |
| 5,332,927 A | 7/1994 | Paul et al. ..................... 307/66 |
| 5,336,993 A | 8/1994 | Thomas et al. ............. 324/158.1 |
| 5,338,515 A | 8/1994 | Dalla Betta et al. ............ 422/95 |
| 5,339,018 A | 8/1994 | Brokaw ........................ 320/147 |
| 5,343,380 A | 8/1994 | Champlin ....................... 363/46 |
| 5,347,163 A | 9/1994 | Yoshimura ...................... 307/66 |
| 5,352,968 A | 10/1994 | Reni et al. .................... 320/136 |
| 5,357,519 A | 10/1994 | Martin et al. ................. 371/15.1 |
| 5,365,160 A | 11/1994 | Leppo et al. ................. 320/160 |
| 5,365,453 A | 11/1994 | Startup et al. .................. 702/36 |
| 5,369,364 A | 11/1994 | Renirie et al. ................ 324/430 |
| 5,381,096 A | 1/1995 | Hirzel ........................... 324/427 |
| 5,387,871 A | 2/1995 | Tsai .............................. 324/429 |
| 5,402,007 A | 3/1995 | Center et al. .............. 290/40 B |
| 3,178,686 A | 4/1995 | Mills ............................ 340/447 |
| 5,410,754 A | 4/1995 | Klotzbach et al. ............ 370/466 |
| 5,412,308 A | 5/1995 | Brown .......................... 323/267 |
| 5,412,323 A | 5/1995 | Kato et al. .................... 324/429 |
| 5,425,041 A | 6/1995 | Seko et al. ................. 372/45.01 |
| 5,426,371 A | 6/1995 | Salley et al. .................. 324/429 |
| 5,426,416 A | 6/1995 | Jefferies et al. .............. 340/664 |
| 5,430,645 A | 7/1995 | Keller ....................... 364/424.01 |
| 5,432,025 A | 7/1995 | Cox ................................ 429/65 |
| 5,432,426 A | 7/1995 | Yoshida ........................ 320/160 |
| 5,434,495 A | 7/1995 | Toko ............................ 320/135 |
| 5,435,185 A | 7/1995 | Eagan ............................ 73/587 |
| 5,442,274 A | 8/1995 | Tamai ........................... 320/146 |
| 5,445,026 A | 8/1995 | Eagan ............................ 73/591 |
| 5,449,996 A | 9/1995 | Matsumoto et al. ........... 320/148 |
| 5,449,997 A | 9/1995 | Gilmore et al. ............... 320/148 |
| 5,451,881 A | 9/1995 | Finger .......................... 324/433 |
| 5,453,027 A | 9/1995 | Buell et al. .................... 439/433 |
| 5,457,377 A | 10/1995 | Jonsson ........................ 324/430 |
| 5,459,660 A | 10/1995 | Berra .............................. 701/33 |
| 5,469,043 A | 11/1995 | Cherng et al. ................ 320/161 |
| 5,485,090 A | 1/1996 | Stephens ...................... 324/433 |
| 5,488,300 A | 1/1996 | Jamieson ...................... 324/433 |
| 5,504,674 A | 4/1996 | Chen et al. ....................... 705/4 |
| 5,508,599 A | 4/1996 | Koenck ........................ 320/138 |
| 5,519,383 A | 5/1996 | De La Rosa ............. 340/636.15 |
| 5,528,148 A | 6/1996 | Rogers ......................... 320/137 |
| 5,537,967 A | 7/1996 | Tashiro et al. ............. 123/192.1 |
| 5,541,489 A | 7/1996 | Dunstan ....................... 320/134 |
| 5,546,317 A | 8/1996 | Andrieu ......................... 702/63 |
| 5,548,273 A | 8/1996 | Nicol et al. ................... 340/439 |
| 5,550,485 A | 8/1996 | Falk ............................. 324/772 |
| 5,561,380 A | 10/1996 | Sway-Tin et al. ............. 324/509 |
| 5,562,501 A | 10/1996 | Kinoshita et al. ............. 439/852 |
| 5,563,496 A | 10/1996 | McClure ...................... 320/128 |
| 5,572,136 A | 11/1996 | Champlin ..................... 324/426 |
| 5,573,611 A | 11/1996 | Koch et al. ................. 152/152.1 |
| 5,574,355 A | 11/1996 | McShane et al. ............. 320/161 |
| 5,578,915 A | 11/1996 | Crouch, Jr. et al. ........... 324/428 |
| 5,583,416 A | 12/1996 | Klang .......................... 320/160 |
| 5,585,416 A | 12/1996 | Audett et al. ................... 522/35 |
| 5,585,728 A | 12/1996 | Champlin ..................... 324/427 |
| 5,589,757 A | 12/1996 | Klang .......................... 320/160 |
| 5,592,093 A | 1/1997 | Klingbiel ..................... 324/426 |
| 5,592,094 A | 1/1997 | Ichikawa ..................... 324/427 |
| 5,596,258 A * | 1/1997 | Kimura et al. ................ 320/163 |
| 5,596,260 A | 1/1997 | Moravec et al. ............. 320/135 |
| 5,596,261 A * | 1/1997 | Suyama ....................... 320/152 |
| 5,598,098 A | 1/1997 | Champlin ..................... 324/430 |
| 5,602,462 A | 2/1997 | Stich et al. .................... 323/258 |
| 5,606,242 A | 2/1997 | Hull et al. ..................... 320/106 |
| 5,614,788 A | 3/1997 | Mullins et al. ................. 315/82 |
| 5,621,298 A | 4/1997 | Harvey ........................ 320/134 |
| 5,633,985 A | 5/1997 | Severson et al. ............. 704/267 |
| 5,637,978 A | 6/1997 | Kellett et al. ................. 320/104 |
| 5,642,031 A | 6/1997 | Brotto .......................... 320/156 |
| 5,650,937 A | 7/1997 | Bounaga ....................... 702/65 |
| 5,652,501 A | 7/1997 | McClure et al. ......... 340/636.15 |
| 5,653,659 A | 8/1997 | Kunibe et al. ................. 477/111 |
| 5,654,623 A | 8/1997 | Shiga et al. ................... 320/106 |
| 5,656,920 A | 8/1997 | Cherng et al. ................ 324/431 |
| 5,661,368 A | 8/1997 | Deol et al. ...................... 315/82 |
| 5,666,040 A | 9/1997 | Bourbeau ..................... 320/118 |
| 5,675,234 A | 10/1997 | Greene .................... 340/636.11 |
| 5,677,077 A | 10/1997 | Faulk ............................. 429/90 |
| 5,684,678 A | 11/1997 | Barrett ........................... 363/17 |
| 5,691,621 A | 11/1997 | Phuoc et al. .................. 320/134 |
| 5,699,050 A | 12/1997 | Kanazawa ............... 340/636.13 |
| 5,701,089 A | 12/1997 | Perkins ........................ 324/772 |
| 5,705,929 A | 1/1998 | Caravello et al. ............. 324/430 |
| 5,707,015 A | 1/1998 | Guthrie ........................ 241/120 |
| 5,710,503 A | 1/1998 | Sideris et al. ................. 320/116 |
| 5,711,648 A | 1/1998 | Hammerslag ................. 414/800 |
| 5,712,795 A | 1/1998 | Layman et al. ............... 700/297 |
| 5,717,336 A | 2/1998 | Basell et al. .................. 324/430 |
| 5,717,937 A | 2/1998 | Fritz ............................. 713/300 |
| 5,721,688 A | 2/1998 | Bramwell ..................... 324/426 |
| 5,732,074 A | 3/1998 | Spaur et al. ................... 370/313 |
| 5,739,667 A | 4/1998 | Matsuda et al. ............... 320/128 |
| 5,744,962 A | 4/1998 | Alber et al. ................... 324/426 |
| 5,745,044 A | 4/1998 | Hyatt, Jr. et al. ............. 340/5.23 |
| 5,747,189 A | 5/1998 | Perkins .......................... 429/91 |
| 5,747,909 A | 5/1998 | Syverson et al. ......... 310/156.56 |
| 5,747,967 A | 5/1998 | Muljadi et al. ................ 320/148 |
| 5,754,417 A | 5/1998 | Nicollini ........................ 363/60 |
| 5,757,192 A * | 5/1998 | McShane et al. ............. 324/427 |
| 5,760,587 A | 6/1998 | Harvey ........................ 324/434 |
| 5,772,468 A | 6/1998 | Kowalski et al. ............. 439/506 |
| 5,773,962 A | 6/1998 | Nor .............................. 320/134 |
| 5,773,978 A | 6/1998 | Becker ......................... 324/430 |
| 5,778,326 A | 7/1998 | Moroto et al. .................. 701/22 |
| 5,780,974 A | 7/1998 | Pabla et al. ..................... 315/82 |
| 5,780,980 A | 7/1998 | Naito ........................... 318/139 |
| 5,789,899 A | 8/1998 | van Phuoc et al. ............ 320/112 |
| 5,793,359 A | 8/1998 | Ushikubo ..................... 345/169 |
| 5,796,239 A | 8/1998 | van Phuoc et al. ............ 320/107 |
| 5,808,469 A | 9/1998 | Kopera ......................... 324/434 |
| 5,811,979 A | 9/1998 | Rhein ........................... 324/718 |
| 5,818,234 A | 10/1998 | McKinnon ................... 324/433 |
| 5,820,407 A | 10/1998 | Morse et al. .................. 439/504 |
| 5,821,756 A | 10/1998 | McShane et al. ............. 324/430 |
| 5,821,757 A | 10/1998 | Alvarez et al. ............... 324/434 |
| 5,825,174 A | 10/1998 | Parker .......................... 324/106 |
| 5,831,435 A | 11/1998 | Troy ............................. 324/426 |
| 5,832,396 A | 11/1998 | Moroto et al. .................. 701/22 |
| 5,850,113 A | 12/1998 | Weimer et al. ................ 307/125 |
| 5,862,515 A | 1/1999 | Kobayashi et al. ............. 702/63 |
| 5,865,638 A | 2/1999 | Trafton ......................... 439/288 |
| 5,871,858 A | 2/1999 | Thomsen et al. ................ 429/7 |
| 5,872,443 A | 2/1999 | Williamson .................. 320/160 |
| 5,872,453 A | 2/1999 | Shimoyama et al. .......... 324/431 |
| 5,883,306 A | 3/1999 | Hwang ....................... 73/146.8 |
| 5,895,440 A | 4/1999 | Proctor et al. .................. 702/63 |
| 5,903,154 A | 5/1999 | Zhang et al. .................. 324/437 |
| 5,903,716 A | 5/1999 | Kimber et al. ................ 395/114 |
| 5,912,534 A | 6/1999 | Benedict ........................ 315/82 |
| 5,914,605 A | 6/1999 | Bertness ...................... 324/434 |
| 5,927,938 A | 7/1999 | Hammerslag ................. 414/809 |
| 5,929,609 A | 7/1999 | Joy et al. ........................ 322/25 |
| 5,939,855 A | 8/1999 | Proctor et al. ................ 320/104 |
| 5,939,861 A | 8/1999 | Joko et al. .................... 320/122 |
| 5,945,829 A | 8/1999 | Bertness ...................... 324/430 |
| 5,946,605 A | 8/1999 | Takahisa et al. ................ 455/68 |
| 5,950,144 A | 9/1999 | Hall et al. ..................... 702/108 |

| | | | |
|---|---|---|---|
| 5,951,229 A | 9/1999 | Hammerslag ................ 414/398 |
| 5,955,951 A | 9/1999 | Wischerop et al. ........ 340/572.8 |
| 5,961,561 A | 10/1999 | Wakefield, II ................. 701/29 |
| 5,961,604 A | 10/1999 | Anderson et al. ............ 709/229 |
| 5,969,625 A | 10/1999 | Russo ..................... 340/636.19 |
| 5,973,598 A | 10/1999 | Beigel ......................... 340/572.1 |
| 5,978,805 A | 11/1999 | Carson ............................ 707/10 |
| 5,982,138 A | 11/1999 | Krieger ......................... 320/105 |
| 5,990,664 A | 11/1999 | Rahman ........................ 320/136 |
| 6,002,238 A | 12/1999 | Champlin ..................... 320/134 |
| 6,005,489 A | 12/1999 | Siegle et al. .............. 340/825.69 |
| 6,005,759 A | 12/1999 | Hart et al. ....................... 361/66 |
| 6,008,652 A | 12/1999 | Theofanopoulos et al. .. 324/434 |
| 6,009,369 A | 12/1999 | Boisvert et al. ................ 701/99 |
| 6,016,047 A | 1/2000 | Notten et al. ................. 320/137 |
| 6,031,354 A | 2/2000 | Wiley et al. .................. 320/116 |
| 6,031,368 A | 2/2000 | Klippel et al. ................ 324/133 |
| 6,037,745 A | 3/2000 | Koike et al. .................. 320/104 |
| 6,037,749 A | 3/2000 | Parsonage ..................... 320/132 |
| 6,037,751 A | 3/2000 | Klang ........................... 320/160 |
| 6,037,777 A | 3/2000 | Champlin ..................... 324/430 |
| 6,037,778 A | 3/2000 | Makhija ........................ 324/433 |
| 6,046,514 A | 4/2000 | Rouillard et al. ................ 307/77 |
| 6,051,976 A | 4/2000 | Bertness ........................ 324/426 |
| 6,055,468 A | 4/2000 | Kaman et al. .................. 701/29 |
| 6,061,638 A | 5/2000 | Joyce .............................. 702/63 |
| 6,064,372 A | 5/2000 | Kahkoska ..................... 345/173 |
| 6,072,299 A | 6/2000 | Kurle et al. ................... 320/112 |
| 6,072,300 A | 6/2000 | Tsuji ............................. 320/116 |
| 6,075,339 A | 6/2000 | Reipur et al. ................. 320/110 |
| 6,081,098 A | 6/2000 | Bertness et al. .............. 320/134 |
| 6,081,109 A | 6/2000 | Seymour et al. .............. 324/127 |
| 6,087,815 A | 7/2000 | Pfeifer et al. ................. 323/282 |
| 6,091,238 A | 7/2000 | McDermott ............... 324/207.2 |
| 6,091,245 A | 7/2000 | Bertness ........................ 324/426 |
| 6,094,033 A | 7/2000 | Ding et al. .................... 320/132 |
| 6,097,193 A | 8/2000 | Bramwell ..................... 324/429 |
| 6,100,670 A | 8/2000 | Levesque ...................... 320/150 |
| 6,100,815 A | 8/2000 | Pailthorp ................. 324/754.07 |
| 6,104,167 A | 8/2000 | Bertness et al. .............. 320/132 |
| 6,113,262 A | 9/2000 | Purola et al. ................... 374/45 |
| 6,114,834 A | 9/2000 | Parise ........................... 320/109 |
| 6,136,914 A | 10/2000 | Hergenrother et al. ....... 524/495 |
| 6,137,269 A | 10/2000 | Champlin ..................... 320/150 |
| 6,140,797 A | 10/2000 | Dunn ............................ 320/105 |
| 6,144,185 A | 11/2000 | Dougherty et al. ........... 320/132 |
| 6,147,598 A | 11/2000 | Murphy et al. ........... 340/426.19 |
| 6,150,793 A | 11/2000 | Lesesky et al. ............... 320/105 |
| 6,158,000 A | 12/2000 | Collins .............................. 713/1 |
| 6,161,640 A | 12/2000 | Yamaguchi ................. 180/65.8 |
| 6,163,156 A | 12/2000 | Bertness ........................ 324/426 |
| 6,164,063 A | 12/2000 | Mendler .......................... 60/274 |
| 6,167,349 A | 12/2000 | Alvarez .......................... 702/63 |
| 6,172,483 B1 | 1/2001 | Champlin ..................... 320/134 |
| 6,172,505 B1 | 1/2001 | Bertness ........................ 324/430 |
| 6,177,737 B1 | 1/2001 | Palfey et al. .................... 307/64 |
| 6,181,545 B1 | 1/2001 | Amatucci et al. ............. 361/502 |
| 6,191,557 B1 | 2/2001 | Gray et al. .................... 320/132 |
| 6,211,651 B1 | 4/2001 | Nemoto ........................ 320/133 |
| 6,215,275 B1 | 4/2001 | Bean ............................. 320/106 |
| 6,218,805 B1 | 4/2001 | Melcher ........................ 320/105 |
| 6,218,936 B1 | 4/2001 | Imao ............................. 340/447 |
| 6,222,342 B1 | 4/2001 | Eggert et al. ................. 320/105 |
| 6,222,369 B1 | 4/2001 | Champlin ..................... 324/430 |
| D442,503 S | 5/2001 | Lundbeck et al. ............. D10/77 |
| 6,225,808 B1 | 5/2001 | Varghese et al. .............. 324/426 |
| 6,236,332 B1 | 5/2001 | Conkright et al. ............. 340/3.1 |
| 6,236,949 B1 | 5/2001 | Hart .............................. 702/64 |
| 6,238,253 B1 | 5/2001 | Qualls .......................... 439/759 |
| 6,242,887 B1 | 6/2001 | Burke ........................... 320/104 |
| 6,249,124 B1 | 6/2001 | Bertness ........................ 324/426 |
| 6,250,973 B1 | 6/2001 | Lowery et al. ................ 439/852 |
| 6,254,438 B1 | 7/2001 | Gaunt ........................... 439/755 |
| 6,259,170 B1 | 7/2001 | Limoge et al. ............. 307/10.8 |
| 6,259,254 B1 | 7/2001 | Klang ........................... 324/427 |
| 6,262,563 B1 | 7/2001 | Champlin ..................... 320/134 |
| 6,263,268 B1 | 7/2001 | Nathanson ..................... 701/29 |
| 6,271,643 B1 | 8/2001 | Becker et al. ................. 320/112 |
| 6,271,748 B1 | 8/2001 | Derbyshire et al. ........... 340/442 |
| 6,275,008 B1 | 8/2001 | Arai et al. ..................... 320/132 |
| 6,285,191 B1 | 9/2001 | Gollomp et al. .............. 324/427 |
| 6,294,896 B1 | 9/2001 | Champlin ..................... 320/134 |
| 6,294,897 B1 | 9/2001 | Champlin ..................... 320/153 |
| 6,304,087 B1 | 10/2001 | Bertness ....................... 324/426 |
| 6,307,349 B1 | 10/2001 | Koenck et al. ................ 320/112 |
| 6,310,481 B2 | 10/2001 | Bertness ........................ 324/430 |
| 6,313,607 B1 | 11/2001 | Champlin ..................... 320/132 |
| 6,313,608 B1 | 11/2001 | Varghese et al. .............. 320/132 |
| 6,316,914 B1 | 11/2001 | Bertness ........................ 320/134 |
| 6,320,351 B1 | 11/2001 | Ng et al. ....................... 320/104 |
| 6,323,650 B1 | 11/2001 | Bertness et al. .............. 324/426 |
| 6,324,042 B1 | 11/2001 | Andrews .................... 361/93.2 |
| 6,329,793 B1 | 12/2001 | Bertness et al. .............. 320/132 |
| 6,331,762 B1 | 12/2001 | Bertness ........................ 320/134 |
| 6,332,113 B1 | 12/2001 | Bertness ......................... 702/63 |
| 6,346,795 B2 | 2/2002 | Haraguchi et al. ............ 320/136 |
| 6,347,958 B1 | 2/2002 | Tsai .............................. 439/488 |
| 6,351,102 B1 | 2/2002 | Troy ............................. 320/139 |
| 6,356,042 B1 | 3/2002 | Kahlon et al. ................ 318/138 |
| 6,356,083 B1 | 3/2002 | Ying .............................. 324/426 |
| 6,359,441 B1 | 3/2002 | Bertness ........................ 324/426 |
| 6,359,442 B1 | 3/2002 | Henningson et al. ......... 324/426 |
| 6,363,303 B1 | 3/2002 | Bertness ......................... 701/29 |
| RE37,677 E | 4/2002 | Irie ................................. 315/83 |
| 6,377,031 B1 | 4/2002 | Karuppana et al. ........... 323/220 |
| 6,384,608 B1 | 5/2002 | Namaky ........................ 324/430 |
| 6,388,448 B1 | 5/2002 | Cervas .......................... 324/426 |
| 6,392,414 B2 | 5/2002 | Bertness ........................ 324/429 |
| 6,396,278 B1 | 5/2002 | Makhija ........................ 324/402 |
| 6,407,554 B1 | 6/2002 | Godau et al. ................. 324/503 |
| 6,411,098 B1 | 6/2002 | Laletin ......................... 324/436 |
| 6,417,669 B1 | 7/2002 | Champlin ..................... 324/426 |
| 6,420,852 B1 | 7/2002 | Sato .............................. 320/134 |
| 6,424,157 B1 | 7/2002 | Gollomp et al. .............. 324/430 |
| 6,424,158 B2 | 7/2002 | Klang ........................... 324/433 |
| 6,437,957 B1 | 8/2002 | Karuppana et al. ............. 361/78 |
| 6,441,585 B1 | 8/2002 | Bertness ........................ 320/132 |
| 6,445,158 B1 | 9/2002 | Bertness et al. .............. 320/104 |
| 6,449,726 B1 | 9/2002 | Smith ........................... 713/340 |
| 6,456,036 B1 | 9/2002 | Thandiwe ..................... 320/106 |
| 6,456,045 B1 | 9/2002 | Troy et al. .................... 320/139 |
| 6,465,908 B1 | 10/2002 | Karuppana et al. ............. 307/31 |
| 6,466,025 B1 | 10/2002 | Klang ........................... 324/429 |
| 6,466,026 B1 | 10/2002 | Champlin ..................... 324/430 |
| 6,469,511 B1 | 10/2002 | Vonderhaar et al. .......... 324/425 |
| 6,477,478 B1 | 11/2002 | Jones et al. ................... 702/102 |
| 6,495,990 B2 | 12/2002 | Champlin ..................... 320/132 |
| 6,497,209 B1 | 12/2002 | Karuppana et al. ....... 123/179.3 |
| 6,500,025 B1 | 12/2002 | Moenkhaus et al. .......... 439/502 |
| 6,505,507 B1 | 1/2003 | Imao ........................... 73/146.5 |
| 6,507,196 B2 | 1/2003 | Thomsen et al. ............. 324/436 |
| 6,526,361 B1 | 2/2003 | Jones et al. ..................... 702/63 |
| 6,529,723 B1 | 3/2003 | Bentley ........................ 455/405 |
| 6,531,848 B1 | 3/2003 | Chitsazan et al. ............. 320/153 |
| 6,532,425 B1 | 3/2003 | Boost et al. .................... 702/63 |
| 6,534,992 B2 | 3/2003 | Meissner et al. .............. 324/426 |
| 6,534,993 B2 | 3/2003 | Bertness ........................ 324/433 |
| 6,536,536 B1 | 3/2003 | Gass et al. ........................ 173/2 |
| 6,544,078 B2 | 4/2003 | Palmisano et al. ............ 439/762 |
| 6,545,599 B2 | 4/2003 | Derbyshire et al. ........... 340/442 |
| 6,556,019 B2 | 4/2003 | Bertness ........................ 324/426 |
| 6,566,883 B1 | 5/2003 | Vonderhaar et al. .......... 324/426 |
| 6,570,385 B1 | 5/2003 | Roberts et al. ................ 324/378 |
| 6,577,107 B2 | 6/2003 | Kechmire ..................... 320/139 |
| 6,586,941 B2 | 7/2003 | Bertness et al. .............. 324/426 |
| 6,597,150 B2 | 7/2003 | Bertness et al. .............. 320/104 |
| 6,599,243 B2 | 7/2003 | Woltermann et al. ......... 600/300 |
| 6,600,815 B1 | 7/2003 | Walding .................... 379/93.07 |
| 6,611,740 B2 | 8/2003 | Lowrey et al. .................. 701/29 |
| 6,614,349 B1 | 9/2003 | Proctor et al. .............. 340/572.1 |
| 6,618,644 B2 | 9/2003 | Bean ............................. 700/231 |
| 6,621,272 B2 | 9/2003 | Champlin ..................... 324/426 |
| 6,623,314 B1 | 9/2003 | Cox et al. ..................... 439/759 |
| 6,624,635 B1 | 9/2003 | Lui ............................... 324/426 |
| 6,628,011 B2 | 9/2003 | Droppo et al. ................. 307/43 |
| 6,629,054 B2 | 9/2003 | Makhija et al. ............... 702/113 |
| 6,633,165 B2 | 10/2003 | Bertness ........................ 324/426 |
| 6,635,974 B1 | 10/2003 | Karuppanana et al. ....... 307/140 |

| | | | | | | |
|---|---|---|---|---|---|---|
| 6,667,624 B1 | 12/2003 | Raichle et al. ............... 324/522 | 2002/0118111 A1 | 8/2002 | Brown et al. ............... 340/573.1 |
| 6,679,212 B2 | 1/2004 | Kelling .................... 123/179.28 | 2002/0171428 A1 | 11/2002 | Bertness ....................... 702/63 |
| 6,686,542 B2 | 2/2004 | Zhang ............................ 174/74 | 2002/0176010 A1 | 11/2002 | Wallach et al. ............... 348/362 |
| 6,696,819 B2 | 2/2004 | Bertness ....................... 320/134 | 2003/0009270 A1 | 1/2003 | Breed ............................ 701/29 |
| 6,707,303 B2 | 3/2004 | Bertness et al. ............. 324/426 | 2003/0025481 A1 | 2/2003 | Bertness ....................... 324/427 |
| 6,736,941 B2 | 5/2004 | Oku et al. ....................... 203/68 | 2003/0036909 A1 | 2/2003 | Kato ............................ 704/275 |
| 6,737,831 B2 | 5/2004 | Champlin .................... 320/132 | 2003/0040873 A1 | 2/2003 | Lesesky et al. ................. 702/57 |
| 6,738,697 B2 | 5/2004 | Breed ............................ 701/29 | 2003/0078743 A1 | 4/2003 | Bertness et al. ............... 702/63 |
| 6,740,990 B2 | 5/2004 | Tozuka et al. ................. 307/9.1 | 2003/0088375 A1 | 5/2003 | Bertness et al. ............... 702/63 |
| 6,744,149 B1 | 6/2004 | Karuppana et al. ............. 307/31 | 2003/0128036 A1 | 7/2003 | Henningson et al. ......... 324/426 |
| 6,745,153 B2 | 6/2004 | White et al. .................. 702/184 | 2003/0169018 A1 | 9/2003 | Berels et al. ................. 320/132 |
| 6,759,849 B2 | 7/2004 | Bertness ....................... 324/426 | 2003/0184262 A1 | 10/2003 | Makhija ....................... 320/156 |
| 6,771,073 B2 | 8/2004 | Henningson et al. ......... 324/426 | 2003/0184306 A1 | 10/2003 | Bertness et al. ............. 324/426 |
| 6,777,945 B2 | 8/2004 | Roberts et al. ............... 324/426 | 2003/0187556 A1 | 10/2003 | Suzuki ........................... 701/29 |
| 6,781,382 B2 | 8/2004 | Johnson ....................... 324/426 | 2003/0194672 A1 | 10/2003 | Roberts et al. ............... 431/196 |
| 6,784,635 B2 | 8/2004 | Larson ......................... 320/104 | 2003/0197512 A1 | 10/2003 | Miller et al. ................. 324/426 |
| 6,784,637 B2 | 8/2004 | Raichle et al. ............... 320/107 | 2003/0212311 A1 | 11/2003 | Nova et al. ................... 600/300 |
| 6,788,025 B2 | 9/2004 | Bertness et al. ............. 320/104 | 2003/0214395 A1 | 11/2003 | Flowerday et al. ........... 340/445 |
| 6,795,782 B2 | 9/2004 | Bertness et al. ............... 702/63 | 2004/0000590 A1 | 1/2004 | Raichle et al. ............ 235/462.01 |
| 6,796,841 B1 | 9/2004 | Cheng et al. ............... 439/620.3 | 2004/0000891 A1 | 1/2004 | Raichle et al. ............... 320/107 |
| 6,805,090 B2 | 10/2004 | Bertness et al. ............... 123/198 | 2004/0000893 A1 | 1/2004 | Raichle et al. ............... 320/135 |
| 6,806,716 B2 | 10/2004 | Bertness et al. ............. 324/426 | 2004/0002824 A1 | 1/2004 | Raichle et al. ................. 702/63 |
| 6,825,669 B2 | 11/2004 | Raichle et al. ............... 324/426 | 2004/0002825 A1 | 1/2004 | Raichle et al. ................. 702/63 |
| 6,842,707 B2 | 1/2005 | Raichle et al. ................. 702/62 | 2004/0002836 A1 | 1/2004 | Raichle et al. ............... 702/188 |
| 6,845,279 B1 | 1/2005 | Gilmore et al. .............. 700/115 | 2004/0032264 A1 | 2/2004 | Schoch ......................... 324/426 |
| 6,850,037 B2 | 2/2005 | Bertness ....................... 320/132 | 2004/0044452 A1 | 3/2004 | Bauer et al. .................... 703/33 |
| 6,871,151 B2 | 3/2005 | Bertness ......................... 702/63 | 2004/0049361 A1 | 3/2004 | Hamdan et al. ............... 702/115 |
| 6,885,195 B2 | 4/2005 | Bertness ....................... 324/426 | 2004/0051533 A1 | 3/2004 | Namaky ....................... 324/426 |
| 6,888,468 B2 | 5/2005 | Bertness .................. 340/636.15 | 2004/0054503 A1 | 3/2004 | Namaky ....................... 702/182 |
| 6,891,378 B2 | 5/2005 | Bertness et al. ............. 324/426 | 2004/0113588 A1 | 6/2004 | Mikuriya et al. ............. 320/128 |
| 6,904,796 B2 | 6/2005 | Pacsai et al. ................. 73/146.8 | 2004/0145342 A1 | 7/2004 | Lyon ............................ 320/108 |
| 6,906,522 B2 | 6/2005 | Bertness et al. ............. 324/426 | 2004/0164706 A1 | 8/2004 | Osborne ....................... 320/116 |
| 6,906,523 B2 | 6/2005 | Bertness et al. ............. 324/426 | 2004/0178185 A1 | 9/2004 | Yoshikawa et al. ........... 219/270 |
| 6,906,624 B2 | 6/2005 | McClelland et al. ......... 340/442 | 2004/0199343 A1 | 10/2004 | Cardinal et al. ................. 702/63 |
| 6,909,287 B2 | 6/2005 | Bertness ....................... 324/427 | 2004/0227523 A1 | 11/2004 | Namaky ....................... 324/537 |
| 6,909,356 B2 | 6/2005 | Brown et al. ................... 340/3.2 | 2004/0239332 A1 | 12/2004 | Mackel et al. ................. 324/426 |
| 6,913,483 B2 | 7/2005 | Restaino et al. ............... 439/504 | 2004/0251876 A1 | 12/2004 | Bertness ....................... 320/136 |
| 6,914,413 B2 | 7/2005 | Bertness et al. ............. 320/104 | 2005/0007068 A1 | 1/2005 | Johnson et al. ............... 320/110 |
| 6,919,725 B2 | 7/2005 | Bertness et al. ............. 324/433 | 2005/0017726 A1 | 1/2005 | Koran et al. ................. 324/433 |
| 6,930,485 B2 | 8/2005 | Bertness et al. ............. 324/426 | 2005/0021294 A1 | 1/2005 | Trsar et al. ................... 702/183 |
| 6,933,727 B2 | 8/2005 | Bertness et al. ............. 324/426 | 2005/0025299 A1 | 2/2005 | Tischer et al. ................. 379/199 |
| 6,941,234 B2 | 9/2005 | Bertness et al. ............... 702/63 | 2005/0043868 A1 | 2/2005 | Mitcham ......................... 701/29 |
| 6,967,484 B2 | 11/2005 | Bertness ....................... 324/426 | 2005/0057256 A1 | 3/2005 | Bertness ....................... 324/426 |
| 6,972,662 B1 | 12/2005 | Ohkawa et al. ............... 340/10.1 | 2005/0102073 A1 | 5/2005 | Ingram ........................... 701/29 |
| 6,998,847 B2 | 2/2006 | Bertness et al. ............. 324/426 | 2005/0128083 A1 | 6/2005 | Puzio et al. ................. 340/572.1 |
| 7,003,410 B2 | 2/2006 | Bertness et al. ............... 702/63 | 2005/0159847 A1 | 7/2005 | Shah et al. .................... 700/276 |
| 7,003,411 B2 | 2/2006 | Bertness ......................... 702/63 | 2005/0168226 A1 | 8/2005 | Quint et al. ................... 324/426 |
| 7,012,433 B2 | 3/2006 | Smith et al. .................. 324/426 | 2005/0173142 A1 | 8/2005 | Cutler et al. .................. 173/181 |
| 7,058,525 B2 | 6/2006 | Bertness et al. ............... 702/63 | 2005/0182536 A1 | 8/2005 | Doyle et al. ..................... 701/29 |
| 7,081,755 B2 | 7/2006 | Klang et al. .................. 324/426 | 2005/0218902 A1 | 10/2005 | Restaino et al. ............... 324/433 |
| 7,098,666 B2 | 8/2006 | Patino .......................... 324/433 | 2005/0254106 A9 | 11/2005 | Silverbrook et al. .......... 358/539 |
| 7,102,556 B2 | 9/2006 | White ........................... 341/141 | 2005/0256617 A1 | 11/2005 | Cawthorne et al. ............ 701/22 |
| 7,106,070 B2 | 9/2006 | Bertness et al. ............. 324/538 | 2006/0012330 A1 | 1/2006 | Okumura et al. ............. 320/103 |
| 7,116,109 B2 | 10/2006 | Klang ........................... 324/426 | 2006/0030980 A1 | 2/2006 | St. Denis ........................ 701/29 |
| 7,119,686 B2 | 10/2006 | Bertness et al. ............. 340/572.1 | 2006/0089767 A1 | 4/2006 | Sowa ............................. 701/29 |
| 7,120,488 B2 | 10/2006 | Nova et al. ...................... 600/2 | 2006/0217914 A1 | 9/2006 | Bertness ....................... 702/113 |
| 7,126,341 B2 | 10/2006 | Bertness et al. ............. 324/426 | 2006/0282323 A1 | 12/2006 | Walker et al. ................. 705/14 |
| 7,129,706 B2 | 10/2006 | Kalley .......................... 324/426 | 2007/0024460 A1 | 2/2007 | Clark ............................ 340/663 |
| 7,182,147 B2 | 2/2007 | Cutler et al. ...................... 173/1 | 2007/0026916 A1 | 2/2007 | Juds et al. ........................ 463/1 |
| 7,184,905 B2 | 2/2007 | Stefan ........................... 702/63 | 2007/0194791 A1 | 8/2007 | Huang .......................... 324/430 |
| 7,200,424 B2 | 4/2007 | Tischer et al. ................. 455/567 | 2008/0303528 A1 | 12/2008 | Kim .............................. 324/430 |
| 7,209,850 B2 | 4/2007 | Brott et al. .................... 324/426 | 2008/0303529 A1 | 12/2008 | Nakamura et al. ............ 324/433 |
| 7,209,860 B2 | 4/2007 | Trsar et al. ................... 702/183 | 2010/0145780 A1 | 6/2010 | Nishikawa et al. ......... 705/14.11 |
| 7,212,887 B2 | 5/2007 | Shah et al ..................... 700/276 | 2010/0314950 A1 | 12/2010 | Rutkowski et al. ........... 307/125 |
| 7,219,023 B2 | 5/2007 | Banke et al. .................. 702/58 | 2011/0004427 A1 | 1/2011 | Gorbold et al. ................. 702/63 |
| 7,233,128 B2 | 6/2007 | Brost et al. ................... 320/132 | | | |
| 7,235,977 B2 | 6/2007 | Koran et al. ................. 324/426 | FOREIGN PATENT DOCUMENTS | | |
| 7,272,519 B2 | 9/2007 | Lesesky et al. ................. 702/63 | EP | 0 022 450 A1 | 1/1981 |
| 7,339,477 B2 | 3/2008 | Puzio et al. ................. 340/572.1 | EP | 0 637 754 A1 | 2/1995 |
| 7,446,536 B2 | 11/2008 | Bertness ....................... 324/426 | EP | 0 772 056 A1 | 5/1997 |
| 7,453,238 B2 | 11/2008 | Melichar ...................... 320/132 | EP | 0 982 159 A2 | 3/2000 |
| 7,657,386 B2 | 2/2010 | Thibedeau et al. ............. 702/63 | FR | 2 749 397 | 12/1997 |
| 7,679,325 B2 | 3/2010 | Seo .............................. 320/116 | GB | 2 029 586 | 3/1980 |
| 2001/0035737 A1 | 11/2001 | Nakanishi et al. ............ 320/122 | GB | 2 088 159 A | 6/1982 |
| 2002/0004694 A1 | 1/2002 | McLeod ......................... 701/29 | GB | 2 246 916 A | 10/1990 |
| 2002/0010558 A1 | 1/2002 | Bertness et al. ............... 702/63 | GB | 2 275 783 A | 7/1994 |
| 2002/0021135 A1 | 2/2002 | Li et al. ........................ 324/677 | GB | 2 387 235 A | 10/2003 |
| 2002/0041175 A1 | 4/2002 | Lauper et al. ................. 320/106 | JP | 59-17892 | 1/1984 |
| 2002/0044050 A1 | 4/2002 | Derbyshire et al. ........... 340/442 | JP | 59-17893 | 1/1984 |

| | | |
|---|---|---|
| JP | 59-17894 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04095788 | 3/1992 |
| JP | 04131779 | 5/1992 |
| JP | 04372536 | 12/1992 |
| JP | 05211724 A | 8/1993 |
| JP | 5216550 | 8/1993 |
| JP | 7-128414 | 5/1995 |
| JP | 09061505 | 3/1997 |
| JP | 10056744 | 2/1998 |
| JP | 10232273 | 9/1998 |
| JP | 11103503 A | 4/1999 |
| RU | 2089015 C1 | 8/1997 |
| WO | WO 93/22666 | 11/1993 |
| WO | WO 94/05069 | 3/1994 |
| WO | WO 96/01456 | 1/1996 |
| WO | WO 96/06747 | 3/1996 |
| WO | WO 96/28846 | 9/1996 |
| WO | WO 97/01103 | 1/1997 |
| WO | WO 97/44652 | 11/1997 |
| WO | WO 98/04910 | 2/1998 |
| WO | WO 98/58270 | 12/1998 |
| WO | WO 99/23738 | 5/1999 |
| WO | WO 00/16083 | 3/2000 |
| WO | WO 00/62049 | 10/2000 |
| WO | WO 00/67359 | 11/2000 |
| WO | WO 01/59443 | 2/2001 |
| WO | WO 01/16614 | 3/2001 |
| WO | WO 01/16615 | 3/2001 |
| WO | WO 01/51947 | 7/2001 |
| WO | WO 03/047064 A3 | 6/2003 |
| WO | WO 03/076960 A1 | 9/2003 |
| WO | WO 2004/047215 A1 | 6/2004 |

OTHER PUBLICATIONS

"A Microprocessor-Based Control System for a Near-Term Electric Vehicle", Bimal K. Bose; IEEE Transactions on Industry Applications, vol. IA-17, No. 6, Nov./Dec. 198?,; 0093-9994/81/1100-0626$00.75 © 1981 IEEE, 6 pages.

Office Action from corresponding U.S. Appl. No. 10/280,186, dated Oct. 14, 2003.

Office Action from corresponding U.S. Appl. No. 10/460,749, dated Dec. 13, 2004.

Office Action from corresponding U.S. Appl. No. 10/958,812, dated Apr. 10, 2007.

Office Action from corresponding U.S. Appl. No. 10/958,812, dated Oct. 18, 2007.

Office Action from corresponding U.S. Appl. No. 10/958,812, dated Nov. 16, 2007.

Office Action from corresponding U.S. Appl. No. 11/063,247, dated Mar. 26, 2007.

Office Action from corresponding U.S. Appl. No. 11/063,247, dated Aug. 14, 2007.

Office Action from corresponding U.S. Appl. No. 11/063,247, dated Jan. 11, 2008.

Office Action from corresponding U.S. Appl. No. 11/063,247, dated Apr. 11, 2008.

Office Action from corresponding U.S. Appl. No. 11/063,247, dated Nov. 14, 2008.

Search Report and Written Opinion from PCT Application No. PCT/US2011/026608, dated Aug. 29, 2011, 9 pgs.

Search Report and Written Opinion from PCT Application No. PCT/US2011/038279, dated Sep. 16, 2011, 12 pgs.

"Electrochemical Impedance Spectroscopy in Battery Development and Testing", *Batteries International*, Apr. 1997, pp. 59 and 62-63.

"Battery Impedance", by E. Willihnganz et al., *Electrical Engineering*, Sep. 1959, pp. 922-925.

"Determining the End of Battery Life", by S. DeBardelaben, *IEEE*, 1986, pp. 365-368.

"A Look at the Impedance of a Cell", by S. Debardelaben, *IEEE*, 1988, pp. 394-397.

"The Impedance of Electrical Storage Cells", by N.A. Hampson et al., *Journal of Applied Electrochemistry*, 1980, pp. 3-11.

"A Package for Impedance/Admittance Data Analysis", by B. Boukamp, *Solid State Ionics*, 1986, pp. 136-140.

"Precision of Impedance Spectroscopy Estimates of Bulk, Reaction Rate, and Diffusion Parameters", by J. Macdonald et al., *J. Electroanal, Chem.*, 1991, pp. 1-11.

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128,131.

IEEE Recommended Practice for Maintenance, Testings, and Replacement of Large Lead Storage Batteries for Generating Stations and Substations, *The Institute of Electrical and Electronics Engineers, Inc., ANSI/IEEE Std*. 450-1987, Mar. 9, 1987, pp. 7-15.

"Field and Laboratory Studies to Assess the State of Health of Valve-Regulated Lead Acid Batteries: Part I Conductance/Capacity Correlation Studies", by D. Feder et al., *IEEE*, Aug. 1992, pp. 218-233.

"JIS Japanese Industrial Standard-Lead Acid Batteries for Automobiles", *Japanese Standards Association UDC*, 621.355.2:629.113.006, Nov. 1995.

"Performance of Dry Cells", by C. Hambuechen, Preprint of *Am. Electrochem. Soc.*, Apr. 18-20, 1912, paper No. 19, pp. 1-5.

"A Bridge for Measuring Storage Battery Resistance", by E. Willihncanz, *The Electrochemical Society*, preprint 79-20, Apr. 1941, pp. 253-258.

National Semiconductor Corporation, "High Q Notch Filter", Mar. 1969, Linear Brief 5.

Burr-Brown Corporation, "Design A 60 Hz Notch Filter with the UAF42", Jan. 1994, AB-071.

National Semiconductor Corporation, "LMF90-$4^{th}$-Order Elliptic Notch Filter", Dec. 1994, RRD-B30M115.

"Alligator Clips with Wire Penetrators" *J.S. Popper, Inc.* product information, downloaded from http://www.jspopper.com/, undated.

"#12: LM78S40 Simple Switcher DC to DC Converter", *ITM e-Catalog*, downloaded from http://www.pcbcafe.com, undated.

"Simple DC-DC Converts Allows Use of Single Battery", *Electronix Express*, downloaded from http://www.elexp.com/t_dc-dc.htm, undated.

"DC-DC Converter Basics", *Power Designers*, downloaded from http://www.powederdesigners.com/InforWeb.design_center/articles/DC-DC/converter.shtm, undated.

"Notification of Transmittal of the International Search Report or the Declaration", PCT/US02/29461, Sep. 17, 2002.

"Notification of Transmittal of the International Search Report or the Declaration", PCT/US03/07546, Mar. 13, 2003.

"Notification of Transmittal of the International Search Report or the Declaration", PCT/US03/06577, Mar. 5, 2003.

"Notification of Transmittal of the International Search Report or the Declaration", PCT/US03/07837, Mar. 14, 2003.

"Improved Impedance Spectroscopy Technique for Status Determination of Production $Li/SO_2$ Batteries" Terrill Atwater et al., pp. 10-113, (1992).

"Notification of Transmittal of the International Search Report or the Declaration", PCT/US03/41561, Dec. 30, 2003.

"Notification of Transmittal of the International Search Report or the Declaration", PCT/US03/27696, Sep. 4, 2003.

"Programming Training Course, 62-000 Series Smart Engine Analyzer", Testproducts Division, Kalamazoo, Michigan, pp. 1-207, (1984).

"Operators Manual, Modular Computer Analyzer Model MCA 3000", Sun Electric Corporation, Crystal Lake, Illinois, pp. 1-1-14-13, (1991).

Supplementary European Search Report Communication for Appl. No. 99917402.2, Jul. 9, 2004.

"Dynamic modelling of lead/acid batteries using impedance spectroscopy for parameter identification", Journal of Power Sources, pp. 69-84, (1997).

Notification of Transmittal the International Search Report for PCT/US03/30707, Sep. 30, 2003.

"A review of impedance measurements for determination of the state-of-charge or state-of-health of secondary batteries", Journal of Power Sources, pp. 59-69, (1998).

"Search Report Under Section 17" for Great Britain Application No. GB0421447.4, Jan. 25, 2008.

"Results of Discrete Frequency Immittance Spectroscopy (DFIS) Measurements of Lead Acid Batteries", by K.S. Champlin et al., *Proceedings of 23rd International Teleco Conference (INTELEC)*, published Oct. 2001, IEE, pp. 433-440.

"Examination Report" from the U.K. Patent Office for U.K. App. No. 0417678.0, Jan. 24, 2005.

Wikipedia Online Encyclopedia, Inductance, 2005, http://en.wikipedia.org/wiki/inductance, pp. 1-5, mutual Inductance, pp. 3, 4.

"Professional BCS System Analyzer Battery-Charger-Starting", pp. 2-8, (2001).

Young Illustrated Encyclopedia Dictionary of Electronics, 1981, Parker Publishing Company, Inc., pp. 318-319.

* cited by examiner

ELECTRONIC BATTERY TESTER OR CHARGER WITH DATABUS CONNECTION The present application is a Continuation-In-Part of U.S. Ser. No. 11/063,247, filed Feb. 22, 2005 which is a Continuation-In-Part of U.S. Ser. No. 10/958,812, filed Oct. 5, 2004, which is a Continuation-In-Part of U.S. Ser. No. 10/460,749, filed Jun. 12, 2003, now U.S. Pat. No. 6,967,484, which is a Continuation-In-Part of U.S. Ser. No. 10/280,186, filed Oct. 25, 2002, now U.S. Pat. No. 6,759,849, which is a Continuation-In-Part of U.S. patent application Ser. No. 09/816,768, filed Mar. 23, 2001, now U.S. Pat. No. 6,586,941, which claims the benefit of U.S. provisional patent application Ser. No. 60/192,222, filed Mar. 27, 2000, the contents of which are hereby incorporated by reference in their entirety.

BACKGROUND OF THE INVENTION

The present invention relates to battery chargers and/or testers of the type used to test and/or charge storage batteries. More specifically, the present invention relates to such devices capable of interfacing with other types of equipment.

Various types of battery testers and charging equipment are known in the art. Examples of various battery testers, chargers and monitors are forth in U.S. Pat. No. 3,873,911, issued Mar. 25, 1975, to Champlin; U.S. Pat. No. 3,909,708, issued Sep. 30, 1975, to Champlin; U.S. Pat. No. 4,816,768, issued Mar. 28, 1989, to Champlin; U.S. Pat. No. 4,825,170, issued Apr. 25, 1989, to Champlin; U.S. Pat. No. 4,881,038, issued Nov. 14, 1989, to Champlin; U.S. Pat. No. 4,912,416, issued Mar. 27, 1990, to Champlin; U.S. Pat. No. 5,140,269, issued Aug. 18, 1992, to Champlin; U.S. Pat. No. 5,343,380, issued Aug. 30, 1994; U.S. Pat. No. 5,572,136, issued Nov. 5, 1996; U.S. Pat. No. 5,574,355, issued Nov. 12, 1996; U.S. Pat. No. 5,583,416, issued Dec. 10, 1996; U.S. Pat. No. 5,585,728, issued Dec. 17, 1996; U.S. Pat. No. 5,589,757, issued Dec. 31, 1996; U.S. Pat. No. 5,592,093, issued Jan. 7, 1997; U.S. Pat. No. 5,598,098, issued Jan. 28, 1997; U.S. Pat. No. 5,656,920, issued Aug. 12, 1997; U.S. Pat. No. 5,757,192, issued May 26, 1998; U.S. Pat. No. 5,821,756, issued Oct. 13, 1998; U.S. Pat. No. 5,831,435, issued Nov. 3, 1998; U.S. Pat. No. 5,871,858, issued Feb. 16, 1999; U.S. Pat. No. 5,914,605, issued Jun. 22, 1999; U.S. Pat. No. 5,945,829, issued Aug. 31, 1999; U.S. Pat. No. 6,002,238, issued Dec. 14, 1999; U.S. Pat. No. 6,037,751, issued Mar. 14, 2000; U.S. Pat. No. 6,037,777, issued Mar. 14, 2000; U.S. Pat. No. 6,051,976, issued Apr. 18, 2000; U.S. Pat. No. 6,081,098, issued Jun. 27, 2000; U.S. Pat. No. 6,091,245, issued Jul. 18, 2000; U.S. Pat. No. 6,104,167, issued Aug. 15, 2000; U.S. Pat. No. 6,137,269, issued Oct. 24, 2000; U.S. Pat. No. 6,163,156, issued Dec. 19, 2000; U.S. Pat. No. 6,172,483, issued Jan. 9, 2001; U.S. Pat. No. 6,172,505, issued Jan. 9, 2001; U.S. Pat. No. 6,222,369, issued Apr. 24, 2001; U.S. Pat. No. 6,225,808, issued May 1, 2001; U.S. Pat. No. 6,249,124, issued Jun. 19, 2001; U.S. Pat. No. 6,259,254, issued Jul. 10, 2001; U.S. Pat. No. 6,262,563, issued Jul. 17, 2001; U.S. Pat. No. 6,294,896, issued Sep. 25, 2001; U.S. Pat. No. 6,294,897, issued Sep. 25, 2001; U.S. Pat. No. 6,304,087, issued Oct. 16, 2001; U.S. Pat. No. 6,310,481, issued Oct. 30, 2001; U.S. Pat. No. 6,313,607, issued Nov. 6, 2001; U.S. Pat. No. 6,313,608, issued Nov. 6, 2001; U.S. Pat. No. 6,316,914, issued Nov. 13, 2001; U.S. Pat. No. 6,323,650, issued Nov. 27, 2001; U.S. Pat. No. 6,329,793, issued Dec. 11, 2001; U.S. Pat. No. 6,331,762, issued Dec. 18, 2001; U.S. Pat. No. 6,332,113, issued Dec. 18, 2001; U.S. Pat. No. 6,351,102, issued Feb. 26, 2002; U.S. Pat. No. 6,359,441, issued Mar. 19, 2002; U.S. Pat. No. 6,363,303, issued Mar. 26, 2002; U.S. Pat. No. 6,377,031, issued Apr. 23, 2002; U.S. Pat. No. 6,392,414, issued May 21, 2002; U.S. Pat. No. 6,417,669, issued Jul. 9, 2002; U.S. Pat. No. 6,424,158, issued Jul. 23, 2002; U.S. Pat. No. 6,441,585, issued Aug. 17, 2002; U.S. Pat. No. 6,437,957, issued Aug. 20, 2002; U.S. Pat. No. 6,445,158, issued Sep. 3, 2002; U.S. Pat. No. 6,456,045; U.S. Pat. No. 6,466,025, issued Oct. 15, 2002; U.S. Pat. No. 6,465,908, issued Oct. 15, 2002; U.S. Pat. No. 6,466,026, issued Oct. 15, 2002; U.S. Pat. No. 6,469,511, issued Nov. 22, 2002; U.S. Pat. No. 6,495,990, issued Dec. 17, 2002; U.S. Pat. No. 6,497,209, issued Dec. 24, 2002; U.S. Pat. No. 6,507,196, issued Jan. 14, 2003; U.S. Pat. No. 6,534,993; issued Mar. 18, 2003; U.S. Pat. No. 6,544,078, issued Apr. 8, 2003; U.S. Pat. No. 6,556,019, issued Apr. 29, 2003; U.S. Pat. No. 6,566,883, issued May 20, 2003; U.S. Pat. No. 6,586,941, issued Jul. 1, 2003; U.S. Pat. No. 6,597,150, issued Jul. 22, 2003; U.S. Pat. No. 6,621,272, issued Sep. 16, 2003; U.S. Pat. No. 6,623,314, issued Sep. 23, 2003; U.S. Pat. No. 6,633,165, issued Oct. 14, 2003; U.S. Pat. No. 6,635,974, issued Oct. 21, 2003; U.S. Pat. No. 6,707,303, issued Mar. 16, 2004; U.S. Pat. No. 6,737,831, issued May 18, 2004; U.S. Pat. No. 6,744,149, issued Jun. 1, 2004; U.S. Pat. No. 6,759,849, issued Jul. 6, 2004; U.S. Pat. No. 6,781,382, issued Aug. 24, 2004; U.S. Pat. No. 6,788,025, filed Sep. 7, 2004; U.S. Pat. No. 6,795,782, issued Sep. 21, 2004; U.S. Pat. No. 6,805,090, filed Oct. 19, 2004; U.S. Pat. No. 6,806,716, filed Oct. 19, 2004; U.S. Pat. No. 6,850,037, filed Feb. 1, 2005; U.S. Pat. No. 6,850,037, issued Feb. 1, 2005; U.S. Pat. No. 6,871,151, issued Mar. 22, 2005; U.S. Pat. No. 6,885,195, issued Apr. 26, 2005; U.S. Pat. No. 6,888,468, issued May 3, 2005; U.S. Pat. No. 6,891,378, issued May 10, 2005; U.S. Pat. No. 6,906,522, issued Jun. 14, 2005; U.S. Pat. No. 6,906,523, issued Jun. 14, 2005; U.S. Pat. No. 6,909,287, issued Jun. 21, 2005; U.S. Pat. No. 6,914,413, issued Jul. 5, 2005; U.S. Pat. No. 6,913,483, issued Jul. 5, 2005; U.S. Pat. No. 6,930,485, issued Aug. 16, 2005; U.S. Pat. No. 6,933,727, issued Aug. 23, 200; U.S. Pat. No. 6,941,234, filed Sep. 6, 2005; U.S. Pat. No. 6,967,484, issued Nov. 22, 2005; U.S. Pat. No. 6,998,847, issued Feb. 14, 2006; U.S. Pat. No. 7,003,410, issued Feb. 21, 2006; U.S. Pat. No. 7,003,411, issued Feb. 21, 2006; U.S. Pat. No. 7,012,433, issued Mar. 14, 2006; U.S. Pat. No. 7,015,674, issued Mar. 21, 2006; U.S. Pat. No. 7,034,541, issued Apr. 25, 2006; U.S. Pat. No. 7,039,533, issued May 2, 2006; U.S. Pat. No. 7,058,525, issued Jun. 6, 2006; U.S. Pat. No. 7,081,755, issued Jul. 25, 2006; U.S. Pat. No. 7,106,070, issued Sep. 12, 2006; U.S. Pat. No. 7,116,109, issued Oct. 3, 2006; U.S. Pat. No. 7,119,686, issued Oct. 10, 2006; and U.S. Pat. No. 7,126,341, issued Oct. 24, 2006; U.S. Pat. No. 7,154,276, issued Dec. 26, 2006; U.S. Pat. No. 7,198,510, issued Apr. 3, 2007; U.S. Pat. No. 7,363,175, issued Apr. 22, 2008; U.S. Pat. No. 7,208,914, issued Apr. 24, 2007; U.S. Pat. No. 7,246,015, issued Jul. 17, 2007; U.S. Pat. No. 7,295,936, issued Nov. 13, 2007; U.S. Pat. No. 7,319,304, issued Jan. 15, 2008; U.S. Ser. No. 09/780,146, filed Feb. 9, 2001, entitled STORAGE BATTERY WITH INTEGRAL BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/880,473, filed Jun. 13, 2001; entitled BATTERY TEST MODULE; U.S. Ser. No. 10/042,451, filed Jan. 8, 2002, entitled BATTERY CHARGE CONTROL DEVICE; U.S. Ser. No. 10/109,734, filed Mar. 28, 2002, entitled APPARATUS AND METHOD FOR COUNTERACTING SELF DISCHARGE IN A STORAGE BATTERY; U.S. Ser. No. 10/112,998, filed Mar. 29, 2002, entitled BATTERY TESTER WITH BAT- TERY REPLACEMENT OUTPUT; U.S. Ser. No. 10/263, 473, filed Oct. 2, 2002, entitled ELECTRONIC BATTERY TESTER WITH RELATIVE TEST OUTPUT; U.S. Ser. No. 10/310,385, filed Dec. 5, 2002, entitled BATTERY TEST MODULE; U.S. Ser. No. 10/462,323, filed Jun. 16, 2003, entitled ELECTRONIC BATTERY TESTER HAVING A USER INTERFACE TO CONFIGURE A PRINTER; U.S. Ser. No. 10/653,342, filed Sep. 2, 2003, entitled ELECTRONIC BATTERY TESTER CONFIGURED TO PREDICT A LOAD TEST RESULT; U.S. Ser. No. 10/441,271, filed May 19, 2003, entitled ELECTRONIC BATTERY TESTER; U.S. Ser. No. 09/653,963, filed Sep. 1, 2000, entitled SYSTEM AND METHOD FOR CONTROLLING POWER GENERATION AND STORAGE; U.S. Ser. No. 10/174,110, filed Jun. 18, 2002, entitled DAYTIME RUNNING LIGHT CONTROL USING AN INTELLIGENT POWER MANAGEMENT SYSTEM; U.S. Ser. No. 10/258, 441, filed Apr. 9, 2003, entitled CURRENT MEASURING CIRCUIT SUITED FOR BATTERIES; U.S. Ser. No. 10/681, 666, filed Oct. 8, 2003, entitled ELECTRONIC BATTERY TESTER WITH PROBE LIGHT; U.S. Ser. No. 10/783,682, filed Feb. 20, 2004, entitled REPLACEABLE CLAMP FOR ELECTRONIC BATTERY TESTER; U.S. Ser. No. 10/791, 141, filed Mar. 2, 2004, entitled METHOD AND APPARATUS FOR AUDITING A BATTERY TEST; U.S. Ser. No. 10/867,385, filed Jun. 14, 2004, entitled ENERGY MANAGEMENT SYSTEM FOR AUTOMOTIVE VEHICLE; U.S. Ser. No. 10/896,834, filed Jul. 22, 2004, entitled ELECTRONIC BATTERY TESTER; U.S. Ser. No. 10/958,821, filed Oct. 5, 2004, entitled IN-VEHICLE BATTERY MONITOR; U.S. Ser. No. 10/958,812, filed Oct. 5, 2004, entitled SCAN TOOL FOR ELECTRONIC BATTERY TESTER; U.S. Ser. No. 11/008,456, filed Dec. 9, 2004, entitled APPARATUS AND METHOD FOR PREDICTING BATTERY CAPACITY AND FITNESS FOR SERVICE FROM A BATTERY DYNAMIC PARAMETER AND A RECOVERY VOLTAGE DIFFERENTIAL, U.S. Ser. No. 60/587,232, filed Dec. 14, 2004, entitled CELLTRON ULTRA, U.S. Ser. No. 11/018,785, filed Dec. 21, 2004, entitled WIRELESS BATTERY MONITOR; U.S. Ser. No. 60/653,537, filed Feb. 16, 2005, entitled CUSTOMER MANAGED WARRANTY CODE; U.S. Ser. No. 11/063,247, filed Feb. 22, 2005, entitled ELECTRONIC BATTERY TESTER OR CHARGER WITH DATABUS CONNECTION; U.S. Ser. No. 11/665,070, filed Mar. 24, 2005, entitled OHMMETER PROTECTION CIRCUIT; U.S. Ser. No. 11/141,234, filed May 31, 2005, entitled BATTERY TESTER CAPABLE OF IDENTIFYING FAULTY BATTERY POST ADAPTERS; U.S. Ser. No. 11/143,828, filed Jun. 2, 2005, entitled BATTERY TEST MODULE; U.S. Ser. No. 11/146,608, filed Jun. 7, 2005, entitled SCAN TOOL FOR ELECTRONIC BATTERY TESTER; U.S. Ser. No. 60,694,199, filed Jun. 27, 2005, entitled GEL BATTERY CONDUCTANCE COMPENSATION; U.S. Ser. No. 11/178,550, filed Jul. 11, 2005, entitled WIRELESS BATTERY TESTER/CHARGER; U.S. Ser. No. 60/705,389, filed Aug. 4, 2005, entitled PORTABLE TOOL THEFT PREVENTION SYSTEM, U.S. Ser. No. 11/207, 419, filed Aug. 19, 2005, entitled SYSTEM FOR AUTOMATICALLY GATHERING BATTERY INFORMATION FOR USE DURING BATTERY TESTER/CHARGING, U.S. Ser. No. 60/712,322, filed Aug. 29, 2005, entitled AUTOMOTIVE VEHICLE ELECTRICAL SYSTEM DIAGNOSTIC DEVICE, U.S. Ser. No. 60/713,168, filed Aug. 31, 2005, entitled LOAD TESTER SIMULATION WITH DISCHARGE COMPENSATION, U.S. Ser. No. 60/731,881, filed Oct. 31, 2005, entitled PLUG-IN FEATURES FOR BATTERY TESTERS; U.S. Ser. No. 60/731, 887, filed Oct. 31, 2005, entitled AUTOMOTIVE VEHICLE ELECTRICAL SYSTEM DIAGNOSTIC DEVICE; U.S. Ser. No. 11/304,004, filed Dec. 14, 2005, entitled BATTERY TESTER THAT CALCULATES ITS OWN REFERENCE VALUES; U.S. Ser. No. 60/751,853, filed Dec. 20, 2005, entitled BATTERY MONITORING SYSTEM; U.S. Ser. No. 11/304,004, filed Dec. 14, 2005, entitled BATTERY TESTER WITH CALCULATES ITS OWN REFERENCE VALUES; U.S. Ser. No. 60/751,853, filed Dec. 20, 2005, entitled BATTERY MONITORING SYSTEM; U.S. Ser. No. 11/352,945, filed Feb. 13, 2006, entitled BATTERY TESTERS WITH SECONDARY FUNCTIONALITY; U.S. Ser. No. 11/356,299, filed Feb. 16, 2006, entitled CENTRALLY MONITORED SALES OF STORAGE BATTERIES; U.S. Ser. No. 11/356,443, filed Feb. 16, 2006, entitled ELECTRONIC BATTERY TESTER WITH NETWORK COMMUNICATION; U.S. Ser. No. 11/498,703, filed Aug. 3, 2006, entitled THEFT PREVENTION DEVICE FOR AUTOMOTIVE VEHICLE SERVICE CENTERS; U.S. Ser. No. 11/507,157, filed Aug. 21, 2006, entitled APPARATUS AND METHOD FOR SIMULATING A BATTERY TESTER WITH A FIXED RESISTANCE LOAD; U.S. Ser. No. 11/511,872, filed Aug. 29, 2006, entitled AUTOMOTIVE VEHICLE ELECTRICAL SYSTEM DIAGNOSTIC DEVICE; U.S. Ser. No. 11/519,481, filed Sep. 12, 2006, entitled BROAD-BAND LOW-CONDUCTANCE CABLES FOR MAKING KELVIN CONNECTIONS TO ELECTROCHEMICAL CELLS AND BATTERIES; U.S. Ser. No. 60/847,064, filed Sep. 25, 2006, entitled STATIONARY BATTERY MONITORING ALGORITHMS; U.S. Ser. No. 11/638,771, filed Dec. 14, 2006, entitled BATTERY MONITORING SYSTEM; U.S. Ser. No. 11/641,594, filed Dec. 19, 2006, entitled METHOD AND APPARATUS FOR MEASURING A PARAMETER OF A VEHICLE ELECTRONIC SYSTEM; U.S. Ser. No. 11/711,356, filed Feb. 27, 2007, entitled BATTERY TESTER WITH PROMOTION FEATURE; U.S. Ser. No. 11/811,528, filed Jun. 11, 2007, entitled ALTERNATOR TESTER; U.S. Ser. No. 60/950,182, filed Jul. 17, 2007, entitled BATTERY TESTER FOR HYBRID VEHICLE; U.S. Ser. No. 60/973,879, filed Sep. 20, 2007, entitled ELECTRONIC BATTERY TESTER FOR TESTING STATIONARY BATTERIES; U.S. Ser. No. 11/931,907, filed Oct. 31, 2007, entitled BATTERY MAINTENANCE WITH PROBE LIGHT; U.S. Ser. No. 60/992,798, filed Dec. 6, 2007, entitled STORAGE BATTERY AND BATTERY TESTER; U.S. Ser. No. 12/099,826, filed Apr. 9, 2008, entitled BATTERY RUN DOWN INDICATOR; U.S. Ser. No. 61/061,848, filed Jun. 16, 2008, entitled KELVIN CLAMP FOR ELECTRONICALLY COUPLING TO A BATTERY CONTACT; which are incorporated herein in their entirety.

In general, battery testing and charging techniques have tended to use a single, integrated stand-alone unit.

SUMMARY OF THE INVENTION

An electronic system or maintenance or diagnostic device for testing or charging a storage battery or electrical system of a vehicle is provided. Circuitry couples to the electrical system of the vehicle and is configured to perform maintenance on the system. Data is communicated wirelessly.

DETAILED DESCRIPTION OF THE PREFERRED EMBODIMENTS

Figure 1:
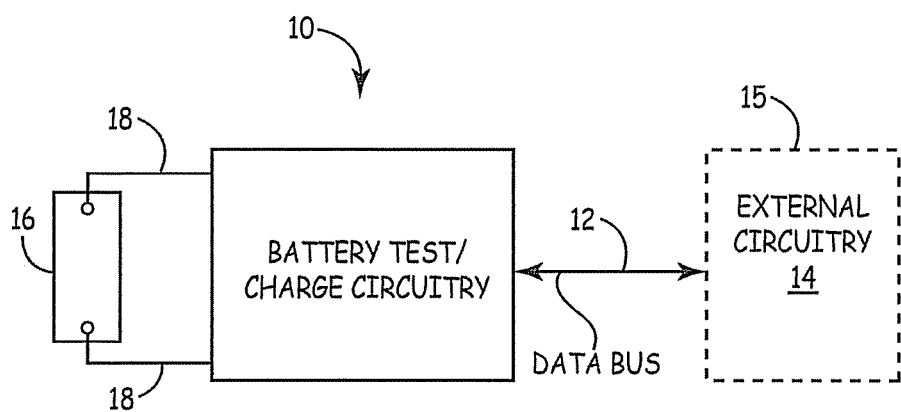
FIG. 1 is a simplified block diagram showing battery test or charge circuitry coupled to an on-board databus of the vehicle.

Typically, vehicle maintenance equipment such as battery testers or battery chargers have been stand-alone units. The present invention provides a vehicle maintenance device 10 which may comprise a diagnostic device, battery charger, battery tester, etc., such as that illustrated in FIG. 1 which includes a databus 12 for coupling to external circuitry 14. Element 10 can comprise, for example, a battery test circuitry, battery charge circuitry, or a combination of both. Circuitry 14 is the internal circuitry of a vehicle 15 coupled together through an OBD (On-Board Diagnostics) databus. Circuitry 10 is configured to couple to storage battery 16 through electrical connectors 18 to perform a battery test on battery 16 or to charge battery 16. Connectors 18 can be, for example, Kelvin type connectors. When configured as a tester, circuitry 10 can obtain a dynamic parameter of the battery using an AC forcing function. Examples include dynamic conductance, resistance, admittance, impedance, their combinations, or others. However, any type of battery test can be performed including battery testing which involves application of large or small loads, or application of large currents or voltages such as through a charger, simple voltage measurements, etc. In one embodiment, the battery tester 10 is permanently mounted in a automotive vehicle such as the type of vehicle that uses a internal combustion engine, electric engine, or a hybrid.

In another configuration, circuitry 10 comprises a battery charger and is configured to charge battery 16 through electrical connections 18. Further, in some configurations, circuitry 10 includes both testing and charging functionality. These functions can operate independently or, in some configurations, can be configured to operate together.

Databus 12 is used to exchange information with external circuitry 14 of vehicle 15. Such information includes, for example, raw data measurements and conclusions of battery tester 10, and inputs, such as user inputs, or any information related to vehicle 15 or other information available on bus 12, along with other sensor inputs into battery tester 10. Further, external circuitry 14 can control or communicate battery tester 10 through databus 12 and provide information such as a battery rating to 10 for use in performing a battery test or charging battery 16. Databus 12 can be a proprietary databus or can be in accordance with known standards such as RS232, CAN, ISA, PCI, PCMCIA, etc. In a specific embodiment, databus 12 is in accordance with an OBD communication protocol.

The circuitry 10 acquires information through bus 12 or monitors the flow of information on a databus of the vehicle. The circuit 10 can obtain information related to battery type, battery rating, charge history, etc. Additionally, if the vehicle contains an internal battery tester, information regarding battery tests or battery measurements can be obtained or monitored through bus 12. In such an embodiment, test circuit 10 does not need to perform a battery test itself, or couple to the battery.

Figure 2A:
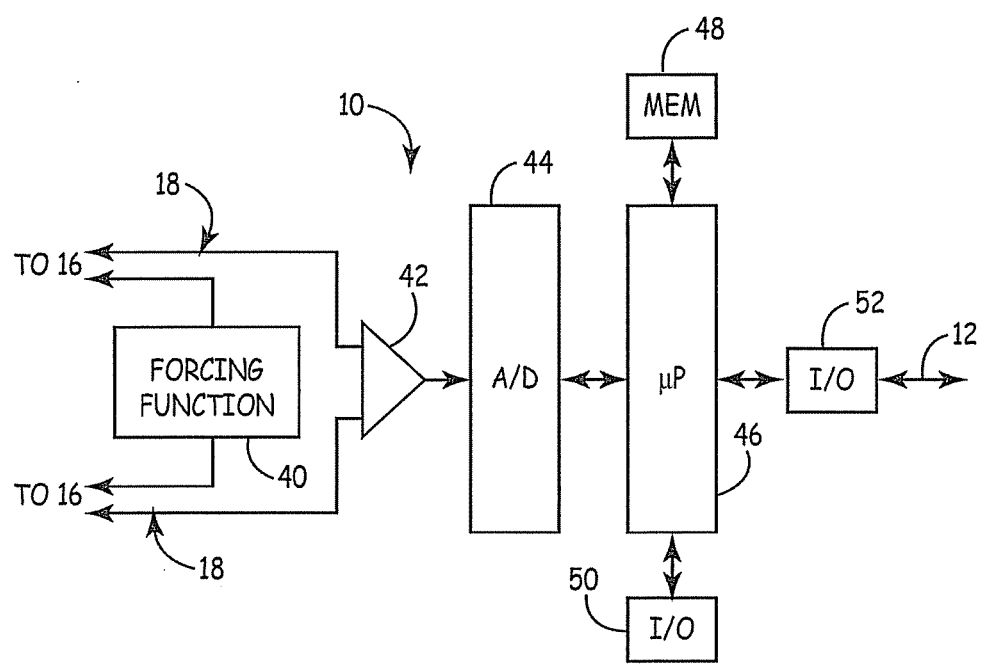
FIG. 2A is a simplified block diagram showing circuitry of FIG. 1 configured as a battery tester.
Figure 2B:
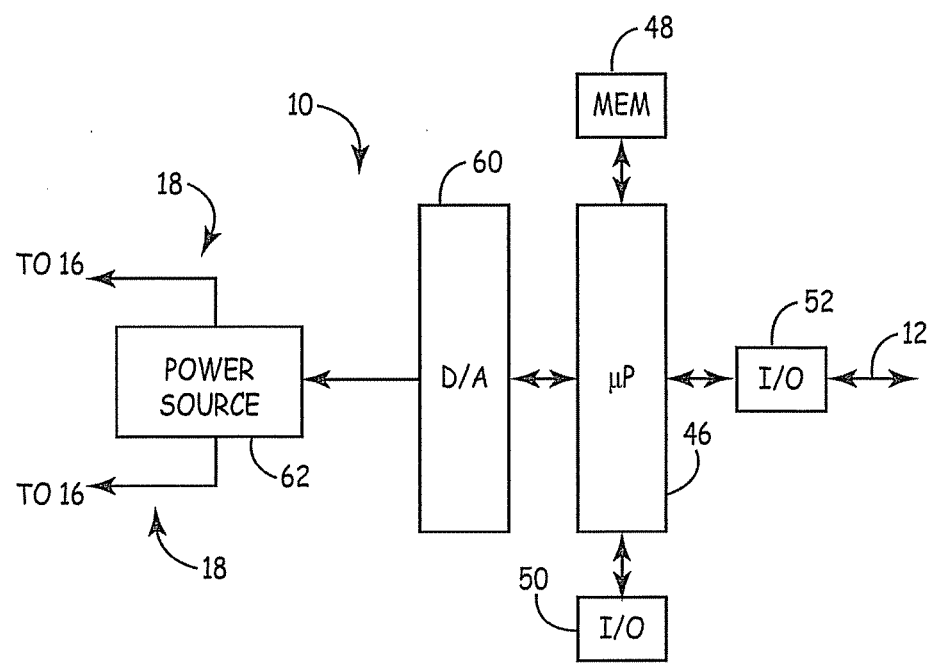
FIG. 2B is a simplified block diagram showing circuitry of FIG. 1 configured as a battery charger.

FIGS. 2A and 2B is a more detailed block diagram of circuitry 10. In FIG. 2A, circuitry 10 is configured to operate as a battery tester and includes a forcing function 40 and an amplifier 42 coupled to connectors 18. Connectors 18 are shown as Kelvin connections. The forcing function 40 can be any type of signal which has a time varying component including a transient signal. The forcing function can be through application of a load or by applying an active signal to battery 16. A response signal is sensed by amplifier 42 and provided to analog to digital converter 44 which couples to microprocessor 46. Microprocessor 46 operates in accordance with instructions stored in memory 48. Input/output (I/O) 52 is provided for coupling to the databus 12. I/O 102 can be in accordance with the desired standard or protocol as described herein. Another input/output block 50 can be used, for example, for communicating with an operator and can comprise a display and an input such as a keypad or the like.

In the illustrated embodiment, microprocessor 46 is configured to measure a dynamic parameter based upon the forcing function 40. This dynamic parameter can be correlated with battery condition as set forth in the above-mentioned Champlin and Midtronics, Inc. patents. However, other types of battery tests circuitry can be used in the present invention and certain aspects of the invention should not be limited to the specific embodiment illustrated herein. Although a microprocessor 46 is shown, other types of computational or other circuitry can be used to collect and place data into memory 48.

FIG. 2B is another simplified block diagram showing circuitry 10 configured as a battery charger. In such a configuration, the microprocessor 46 couples to a digital to analog converter 60 which is used to control a power source 62. Power source 62 couples to battery 16 through connections 18. Although a digital to analog converter 60 is illustrated as controlling a power source 62, other types of control can be used, for example, a simple switch, or other control mechanisms. The power source 62 can operate in accordance with any charging technique and may includes an internal power supply for charging the battery, or can be configured to couple to an external power source. One common external power source is simply the standard 120 volt, or 240 volt outlet power available in most settings. The power supply can also be used to power other aspects of circuitry 10. In one configuration the charger is separate from vehicle 15 and is not powered by an engine in the vehicle.

Figure 3:
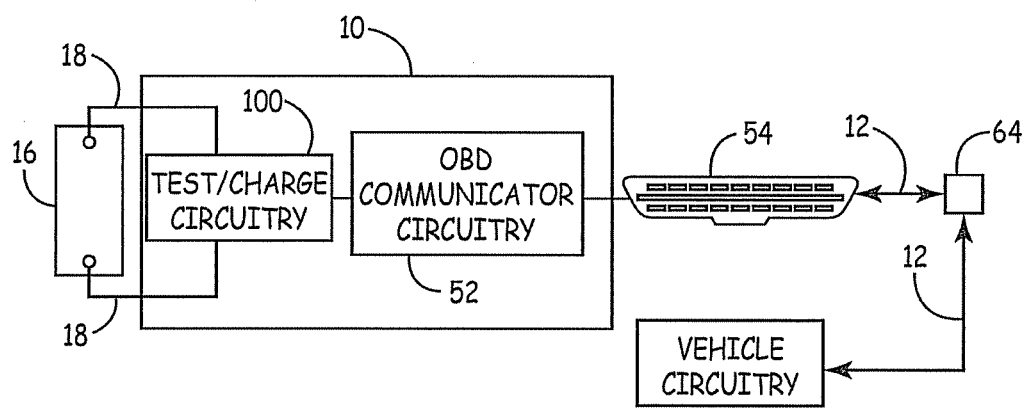
FIG. 3 is a block diagram showing a coupling between circuitry of FIG. 1 and the on-board databus of the vehicle.

FIG. 3 is a simplified block diagram showing an example configuration of battery tester/charger 10 in accordance with one embodiment of the invention. In the embodiment of FIG. 3, circuitry 10 is shown coupled to storage battery 16 through connections 18. As discussed above, this may comprise, for example, Kelvin connections. Circuitry 10 includes tester or charge circuitry 100. The circuitry 100 can be in accordance with any battery tester measurement or charging technique including those discussed above. The circuitry 100 may, in some configurations, include a microprocessor or other digital controller.

Circuitry 100 is configured to couple to battery 16 through electrical connectors 18. The circuitry 100 receives information from OBD communication circuitry 52. OBD communication circuitry 52 communicates through an OBD connector 54. The OBD communication circuitry 52 is configured to operate in accordance with OBD communication standards, such as, for example, J1850 PWM, J1850 VPW and/or ISO9141/14230. OBD communication circuitry 52 communicates in accordance with an OBD communication standard over databus 12 through OBD connector 54. OBD connector 54 is configured to be a standard OBD connection of the type used in automotive vehicles, for example in accordance with the standard J1962 connector. In various embodiments, circuitry within device 10 is powered by power received from battery 16, from an internal power source within device 10, and/or from power received from an external source.

The connector 54 includes 16 electrical "pins" or connectors and is configured to receive and electrically couple to an OBD plug 64 of vehicle 15. Circuitry 52 operates in accordance with OBD communication protocols for use in querying and communicating with the electrical system of automotive vehicles.

During operation as a battery tester, circuitry 10 performs a battery test on the storage battery 16. In accordance with the present invention, the battery tester receives information from the databus of the vehicle over the OBD connection. The data can be used as part of the battery test such that the battery test output is a function of the data, or can be used in addition to the battery test itself. In one aspect, any type of data which is available over the on-board databus of a vehicle. Specific examples include obtaining information regarding the age of the vehicle, battery specifications, number of times that the engine of the vehicle has been started, number of times that the battery has been disconnected, the size of the alternator, and the electrical options on a vehicle. Further, diagnostic information can be provided by the on-board databus including information related to the state of charge of the battery, the current draw from the battery, or the current draw of specific components of the electrical system, the starter voltage, etc. The information can be used to diagnose operation of the vehicle electrical system to assist in the battery test, or to assist in charging the battery. Some types of on-board databuses used in vehicles can contain a significant amount of information and data collected and generated based upon operation of the vehicle and subsystems thereof. This information can also be used by the circuitry 10.

In addition to receiving information from the databus, with the present invention, the on-board databus of the vehicle can be used to control operation of the vehicle. For example, operation of the engine can be controlled (such as engine speed), various loads within the vehicle can be turned on or off, the alternator set point can be controlled, starting of the vehicle can be inhibited, etc. This can also be used in configuration with testing or charging.

Newer types of vehicles include all electrical vehicles and hybrid vehicles which use a combination of both battery and internal combustion engines. In such vehicles, it can be difficult to directly test individual batteries of the vehicle. However, by using the ability of the present invention to access the on-board databus of the vehicle, additional information can be obtained during testing and/or charging of the batteries within the vehicle. For example, loads within the vehicle can be controlled, various voltages within the vehicle can be monitored, etc. In configurations in which the circuitry of the present invention is used to charge the battery, the on-board databus can be used to monitor the vehicle while the battery is being charged. For example, the databus can be used to obtain voltage (such as individual batteries or groups of batteries), or other information, from the vehicle as the vehicle undergoes charging.

When the circuitry of the present invention is configured as a charger, all of the information and control discussed above can be used in combination with charging of the vehicle. In some configurations, this can be used to provide feedback to the charging circuitry so that the charging can be controlled or terminated as desired.

With the present invention, any information which is available from the onboard databus can be used in conjunction with testing and/or charging. For example, information regarding the vehicle such as a vehicle identification number (VIN), battery type, battery voltage during start, vehicle age, engine size, and other information. The connection to the OBD can be used to control idle speed of the engine, turn on loads of the vehicle and to further automate aspects of the testing. Engine speed can also be read from the OBD connection. In some configurations, the circuitry is configured to test other aspects of the vehicle such as the alternator. The onboard OBD connection to the vehicle can be used to control aspects of the vehicle for alternator testing. Trouble codes within the vehicle system can be set using the OBD connection. For example, if a high rate of charging is detected, a trouble code can be set accordingly. In some vehicles, the connection to the OBD of the vehicle can be used to reset trouble codes. For example, the occurrence of a successful charge of the battery can be used to reset a trouble code. In some vehicles, various temperatures can be obtained from the onboard databus. This temperature information can also be used in conjunction with testing or charging. Engine hours, key off statistics, alternator current output and other information can be made available.

In some types of hybrid vehicles that contain multiple batteries, the on-board databus can be used to access intermediary voltages within a string of batteries. This information can be used by the present invention to, for example, detect imbalances in the voltages which may occur during charging. Such an imbalance can be indicative of a failing battery within the string.

The present invention provides a battery test, electrical system test and/or battery charger for use with vehicles, including hybrid vehicles. The circuitry of the present invention couples to the on-board databus of a vehicle and uses information from the databus, or controls aspects of the vehicle through the databus, in conjunction with the testing or charging. In some aspects, the test or charge is a function of information retrieved from the on-board databus. In other aspects, the test or charge controls operation of components of the vehicle using the connection of the vehicle through the on-board databus.

Figure 4:
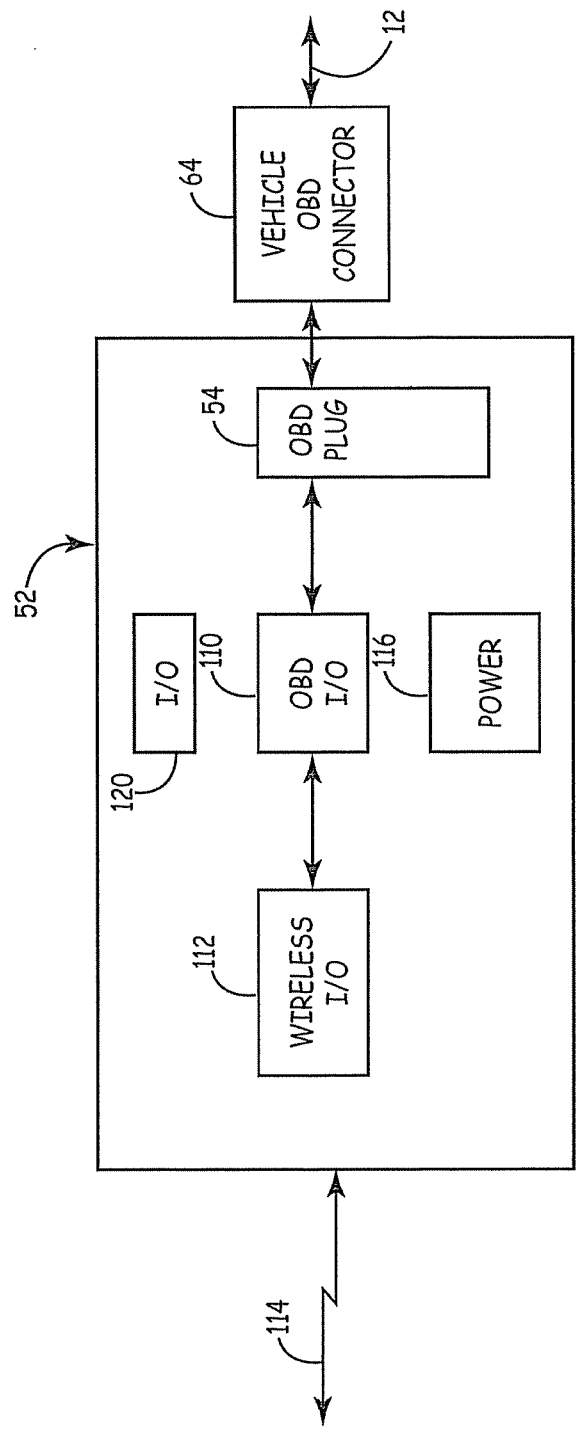
FIG. 4 is a simplified block diagram of a wireless OBD connector.

Although the various connections between components shown here are illustrated as being wired connections, the invention is also applicable with wireless connections such as using radiofrequency (RF), infrared (IR), inductive coupling or through other wireless techniques. By providing the circuitry with access to the on board database of the vehicle, additional information can be garnered regarding operation of the vehicle and, in some configurations, operation of the vehicle can be controlled or otherwise configured. For example, the OBD communication circuitry 52, the test/charge circuitry 100 or other circuitry can be wirelessly coupled together. In such a configuration, circuitry 52 can be embodied in an OBD or databus connector having an OBD plug 54 can be configured to connect to the OBD databus of the vehicle and wirelessly transmit information to diagnostic/maintenance circuitry 10. FIG. 4 shows one example configuration in which OBD communication circuitry includes OBD I/O circuit 110 which couples to wireless I/O circuitry 112. Power supply circuitry 116 is provided and may comprise, for example, a battery or other power storage device or may be configured to receive power from the vehicle 15, for example, over the OBD databus 12. A wireless communication signal 114 is used to exchange data between OBD communication circuitry 52 and test/charge circuitry 100. Additionally, an I/O circuitry 120 is illustrated in FIG. 4. This can comprise, for example, a local I/O, such as a display or other visible output for use by an operator and/or an input such as one or more buttons or the like. In such a configuration, test information can be displayed locally to the operator, or the operator can control operation of the OBD communication circuitry 52. In some embodiments, a microprocessor is included in OBD communication circuitry 52, for example, within OBD I/O circuitry 110. In such a configuration, OBD circuitry 110 also includes a memory and other supporting electronics as needed. In one configuration, the battery test is performed using data retrieved from the OBD communication circuitry related to voltage(s) and/or current(s) of the vehicle electrical system. This information may be collected using sensor of the vehicle which provide information to the databus of the vehicle. The tester can also be used to instruct an operator to perform various operations with the vehicle such as acceleration, braking, etc. Vehicle operation can be monitored by observing RPM, speed, accelerator position, brake position, etc.

Figure 5:
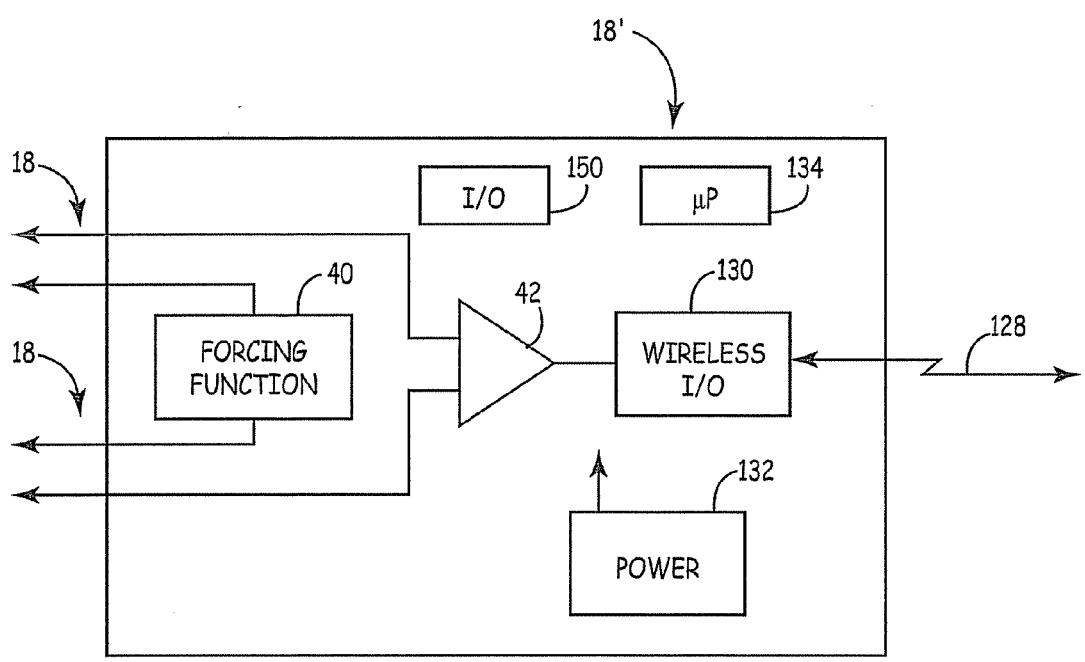
FIG. 5 is a simplified block diagram of a wireless Kelvin connector.

FIG. 5 shows another example configuration of wireless communication between components. In FIG. 5, wireless Kelvin connector 18' is shown which includes Kelvin connections 18, forcing function 40 and differential amplifier 42. Kelvin connector 18' wireless I/O circuitry 130 is configured to provide a wireless output 128 based upon the sensed voltage across Kelvin connectors 18. Additionally, wireless communication link 128 can be used to control operation of wireless Kelvin connector 18'. Power supply circuitry 132 is also shown. Power supply circuitry 132 can provide power to wireless Kelvin connector 18', for example, by obtaining power through the Kelvin connections 18 to the battery, or through an internal battery or other power source. I/O circuitry 150 is also illustrated which is used to provide a local interface to an operator. For example, measurements may be displayed, information related to the coupling between the individual connectors 18 and the battery may be displayed, or an operator may control operation of the wireless amp clamp 18' or of other test circuitry. An optional microprocessor 134 is also shown in FIG. 5. In such a configuration, microprocessor 134 can operate in accordance with instructions stored in an internal memory and may provide additional data processing or functionality. For example, the data transmitted over wireless communication link 128 may contain information related to the measured Cold Cranking Amps (CCA) of the battery, temperature, or other data.

Figure 6:
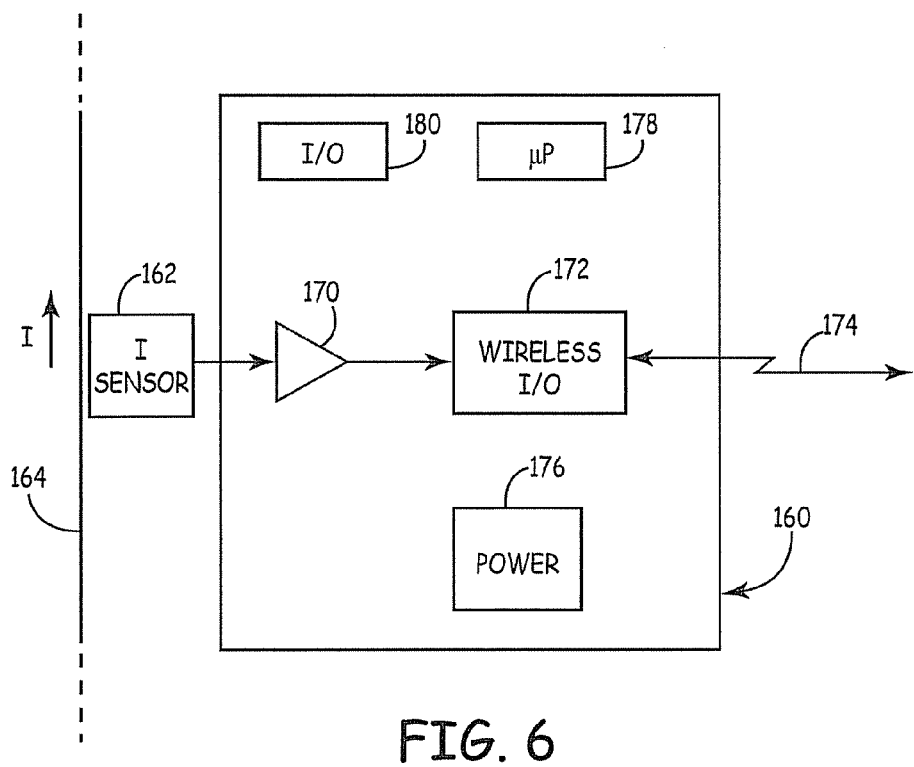
FIG. 6 is a simplified block diagram of a wireless current sensor.

FIG. 6 shows another example configuration in which a wireless "amp clamp" or current sensor 160 is provided. Wireless current sensor 160 includes a current sensor 162 configured to sense a current I, for example, through a wire 164 of the vehicle 15. The output from current sensor 162 is amplified by amplifier 170 and transmitted wirelessly over a wireless communication link 174 through wireless I/O circuitry 172. Power supply circuitry 176 is used to provide power to wireless current sensor 160 and may include a internal battery for powering the device, for example. An optional microprocessor 178 is provided to control operation of wireless current sensor 160 and may include an internal memory for storing instructions or other information. As discussed above, an input/output 180 can be provided, for example, for allowing local operator interaction with wireless current sensor 160. This may include current measurements, information about the connection between current sensor 162 and wire 164, or be used to provide instructions or control regarding the operation of wireless current sensor 160, for example, causing the device to initiate a test. The various wireless transmissions discussed above may include analog or digital information as desired. The transmissions may be between the device and, for example, a diagnostic circuitry such as battery tester or charger 10.

As discussed above, using the data connection to the databus 12 of vehicle 15, diagnostic circuitry 10 can be used to control operation of various components of the vehicle during testing. For example, the engine, brakes, windows, lights, radio, navigation equipment, heating/cooling equipment, or other components of the vehicle may be controller. Using this feature, various tests and diagnostics on the vehicle 15 can be performed by those known in the art.

The various diagnostics can be integrated with the VIN/ identification information for vehicle 15. This can provide information related to acceptable operation of components, parameters related to the battery or other components, etc. The VIN/ID information can be entered manually by an operator or can be retrieved from vehicle 15 over databus 12. Similarly, if vehicle 15 stores information related to operation, this historical information can be retrieved over the databus 12. This can provide an indication regarding a weak battery if the battery has at times failed to start the vehicle or has not been accepting charge. If the circuitry 10 is used for charging the vehicle, the information retrieved from the vehicle can be used to control operation of the charging. For example, the charging can be based upon the particular battery, historical information related to the battery, etc.

The determined diagnostic information can also be provided back to vehicle 15 over databus 12 for storage in a memory of the vehicle or for other purposes. This can be used to store battery test information or other diagnostics whereby subsequent diagnostics may retrieve historical diagnostic information from the vehicle.

Although the present application describes the OBD communication protocol, "OBD" is intended to include OBD II communication protocol as well. Example protocols include ISO and SAE standards. Specific examples include:
ISO 9141
ISO 9141-2
ISO 14230
ISO14230 1/2/3/4 Keyword Protocol 2000
ISO11519 1/2/3 Low speed serial data communication
ISO11898 1/2/3/4 CAN physical layer
ISO11992 1/2/3 Digital information on electrical connections between towing and towed vehicles
ISO 15765: 1/2/3/4 Diagnostics on CAN
SAE J1850 PWM
SAE J1850 VPW
SAE J1939: Recommended practice for Truck and Bus control and communication network
SAE J2561: Bluetooth wireless protocol for automotive application
SAE J1708: Serial data communication between microcomputer systems in Heavy-Duty Vehicle applications
SAE J1850: Class B Data communication network for vehicle application
SAE J2411: Single wire CAN network for vehicle application
SAE J2610: SCI Communication
SAE J2602: LIN Network for vehicle applications
SAE J2284-1: High speed CAN at 125 kbps
SAE J2284-2: High speed CAN at 250 kbps
SAE J2284-3: High speed CAN at 500 kbps SAE J2366-1 ITS Databus Although the present invention has been described with reference to preferred embodiments, workers skilled in the art will recognize that changes may be made in form and detail without departing from the spirit and scope of the invention. For example, any type of battery test or battery charge circuitry can be used by battery tester 10. Further, the databus 12 can be in accordance with any databus technique and should not be limited to the examples set forth herein. In various embodiments, vehicle 15 comprises a vehicle having only internal combustion engine, an electric vehicle, or a hybrid vehicle using both electric and combustion power. The circuitry 10 may be separate from the vehicle 15. For example, the circuitry 10 can be embodied in a portable battery tester or charger. In another example, circuitry 10 is implemented in the vehicle itself. As used herein "battery maintenance device" refers generally to element 10 or variations thereof, and comprises a battery tester, a battery charger, or a device which is both a battery tester and a battery charger. Thus, circuitry 10 provides a battery maintenance device and includes generally battery maintenance circuitry such as circuitry 100 shown in FIG. 3. Any type of wireless communication can be employed including RF, optical, IR, sonic or ultrasonic, inductive coupling, magnetic coupling or others.

What is claimed is:

1. A battery maintenance device for use with a storage battery of a vehicle, comprising:
   electrical connectors configured to couple to the battery and perform maintenance on the battery;
   a databus connector configured to plug into an OBD connector of the vehicle which connects to a databus of the vehicle which carries information related to the vehicle, the databus connector includes wireless I/O circuitry; and
   battery maintenance circuitry coupled to the electrical connectors and configured to communicate wirelessly with the databus connector, to perform maintenance on the battery through the electrical connectors and to receive information related to the vehicle from the databus, wherein the maintenance performed on the battery is a function of the information related to the vehicle received from the databus.

2. The device of claim 1 wherein the battery maintenance circuitry is configured to communicate wirelessly using a radio frequency (RF) signal.

3. The device of claim 1 wherein the battery maintenance circuitry is configured to communicate wirelessly using infrared (IR).

4. The device of claim 1 wherein the databus connector includes a power supply.

5. The device of claim 4 wherein the power supply is configured to receive power from the vehicle.

6. The device of claim 1 wherein the electrical connectors comprise electrical connectors within the vehicle coupled to the databus of the vehicle.

7. The device of claim 1 wherein the databus connector is configured to display information to an operator.

8. The device of claim 1 wherein the databus connector includes an input configured to receive an input from an operator.

9. The device of claim 1 wherein the databus connector includes a microprocessor.

10. The device of claim 1 wherein the electrical connectors are configured to couple to the battery comprise a wireless battery connector configured to wirelessly communicate with the battery maintenance circuitry.

11. The device of claim 10 wherein the wireless communication between the battery maintenance circuitry and the battery connector comprises an infrared connection.

12. The device of claim 10 wherein the wireless communication between the battery maintenance circuitry and the battery connector comprises a radio frequency (RF) signal.

13. The device of claim 10 wherein the battery connector includes a power supply configured to provide power to circuitry in the battery connector.

14. The device of claim 13 wherein the power supply is powered from the storage battery.

15. The device of claim 10 wherein the battery connector includes Kelvin connections and is configured to measure a dynamic parameter of the battery.

16. The device of claim 15 wherein the battery connector includes a forcing function configured to apply a signal between the terminals of the battery through the Kelvin connections and a differential amplifier configured to measure a voltage between terminals through the Kelvin connection.

17. The device of claim 10 wherein the battery connector includes a microprocessor.

18. The device of claim 10 wherein the battery connector includes a display configured to display information to an operator.

19. The device of claim 10 wherein the battery connector includes a user input configured to receive an input from an operator.

20. The device of claim 1 including a current sensor configured to sense current flowing through a wire of a vehicle.

21. The device of claim 20 wherein the current sensor is configured to communicate wirelessly with the battery maintenance circuitry.

22. The device of claim 21 wherein the current sensor is configured to communicate through an infrared connection.

23. The device of claim 21 wherein the current sensor is configured to communicate through a radio frequency (RF) signal.

24. The device of claim 20 wherein the current sensor includes a power supply.

25. The device of claim 20 wherein the current sensor includes a microprocessor.

26. The device of claim 20 wherein the current sensor includes a display configured to display information to an operator.

27. The device of claim 20 wherein the current sensor includes a user input configured to receive an input from an operator.

28. The device of claim 1 wherein the battery maintenance circuitry is configured to perform a test on the storage battery of the vehicle.

29. The device of claim 1 wherein the battery maintenance circuitry is configured to charge the storage battery of the vehicle.

30. A method of performing maintenance on a storage battery of a vehicle, comprising:
   electrically coupling to the battery with electrical connectors;
   coupling a databus connector to an OBD connector of the vehicle which connects to a databus of the vehicle which carries information related to the vehicle;
   communicating with battery maintenance circuitry over a wireless communication link between the databus connector and the battery maintenance circuitry; and
   performing maintenance on the battery through the electrical connectors and as a function of information received wirelessly from the databus connector coupled to the databus of the vehicle.

* * * * *